United States Patent
Mochizuki et al.

(10) Patent No.: US 9,000,365 B2
(45) Date of Patent: Apr. 7, 2015

(54) PATTERN MEASURING APPARATUS AND COMPUTER PROGRAM

(75) Inventors: Yuzuru Mochizuki, Hitachinaka (JP); Maki Tanaka, Mito (JP); Miki Isawa, Hitachinaka (JP); Satoru Yamaguchi, Hitachinaka (JP)

(73) Assignee: Hitachi High-Technologies Corporation, Tokyo (JP)

( * ) Notice: Subject to any disclaimer, the term of this patent is extended or adjusted under 35 U.S.C. 154(b) by 453 days.

(21) Appl. No.: 13/263,826

(22) PCT Filed: Apr. 7, 2010

(86) PCT No.: PCT/JP2010/002524
§ 371 (c)(1),
(2), (4) Date: Oct. 10, 2011

(87) PCT Pub. No.: WO2010/119641
PCT Pub. Date: Oct. 21, 2010

(65) Prior Publication Data
US 2012/0037801 A1     Feb. 16, 2012

(30) Foreign Application Priority Data

Apr. 14, 2009   (JP) ................................ 2009-097572

(51) Int. Cl.
*G01N 23/00* (2006.01)
*G01B 15/04* (2006.01)
(Continued)

(52) U.S. Cl.
CPC ............... *G01B 15/04* (2013.01); *G01B 15/00* (2013.01); *H01L 22/12* (2013.01)

(58) Field of Classification Search
None
See application file for complete search history.

(56) References Cited

U.S. PATENT DOCUMENTS

| | | | |
|---|---|---|---|
| 6,872,943 B2 | 3/2005 | Takane et al. | |
| 8,538,130 B2 * | 9/2013 | Ivanchenko et al. | 382/144 |
| 2004/0222375 A1 * | 11/2004 | Kimura et al. | 250/310 |

FOREIGN PATENT DOCUMENTS

| | | |
|---|---|---|
| JP | 3-266444 | 11/1991 |
| JP | 05-041195 | 2/1993 |
| JP | 05-175496 | 7/1993 |

(Continued)

OTHER PUBLICATIONS

J. Finder et al., "Double patterning for 32nm and below: an update," Proc. Of SPIE, vol. 6924, 692408, 2008, pp. 1-12.

(Continued)

*Primary Examiner* — Andrew Smyth
(74) *Attorney, Agent, or Firm* — McDermott Will & Emery LLP

(57) ABSTRACT

Provided are a pattern measuring apparatus and a computer program which determine whether a gap formed in a sample (201) is a core gap (211) or a spacer gap (212). The secondary electron profile of the sample (201) is acquired, the feature quantities of the secondary electron profile at the positions of edges (303, 305) are detected, and based on the detected feature quantities, whether each gap adjacent to each of the edges (303, 305) is the core gap (211) or the spacer gap (212) is determined. Furthermore, the waveform profile of the spacer (207) is previously stored, the secondary electron profile of the sample (201) is acquired, a matching degree of the secondary electron profile and the stored waveform profile at the position of each spacer (207) is detected, and based on the detected matching degree, whether the each gap adjacent to each spacer (207) is the core gap (211) or the spacer gap (212) is determined.

7 Claims, 23 Drawing Sheets

(51) Int. Cl.
    *G01B 15/00*     (2006.01)
    *H01L 21/66*     (2006.01)

(56) References Cited

FOREIGN PATENT DOCUMENTS

| JP | 2001-147113 | | | 5/2001 | | |
|----|-------------|---|---|--------|---|---|
| JP | 2003-037139 | | | 2/2003 | | |
| JP | 2003-090719 | | | 3/2003 | | |
| JP | 2004-251674 | | | 9/2004 | | |
| JP | 2004251674 | A | * | 9/2004 | ............. | G01B 15/04 |
| JP | 2007-129059 | | | 5/2007 | | |
| JP | 2008-118033 | | | 5/2008 | | |
| JP | 2012-519391 | A | | 8/2012 | | |
| WO | 2010/103506 | A1 | | 9/2010 | | |
| WO | WO 2010103506 | A1 | * | 9/2010 | ................ | G03F 7/20 |

OTHER PUBLICATIONS

A. Miller et al., "Comparison of LFLE and LELE Manufacturability," 5th International Symposium on Immersion Lithography Extensions, Sep. 2008.

K. Lucas et al., "Interactions of double patterning technology with wafer processing, OPC and design flows," Proc. Of SPIE vol. 6924, 692403, 2008, pp. 1-12.

English translation of Japanese Office Action issued in Japanese Patent Application No. JP 2009-097572 dated May 17, 2013.

* cited by examiner

FIG.3
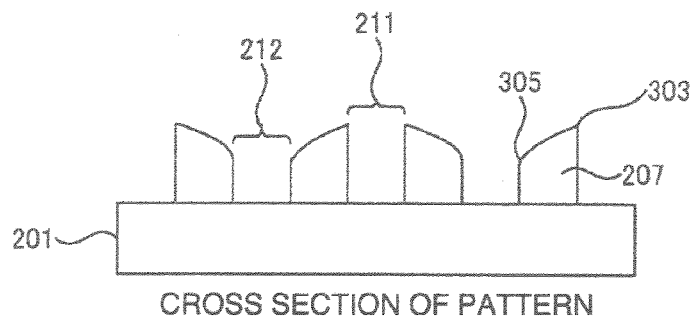
CROSS SECTION OF PATTERN
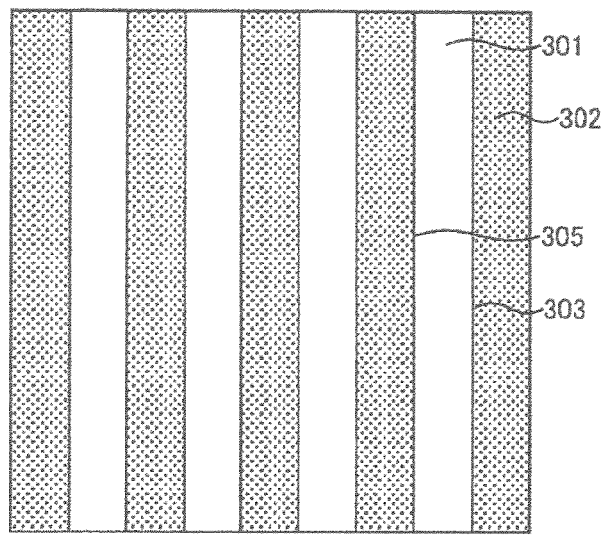
ELECTRON MICROSCOPE IMAGE OF PATTERN
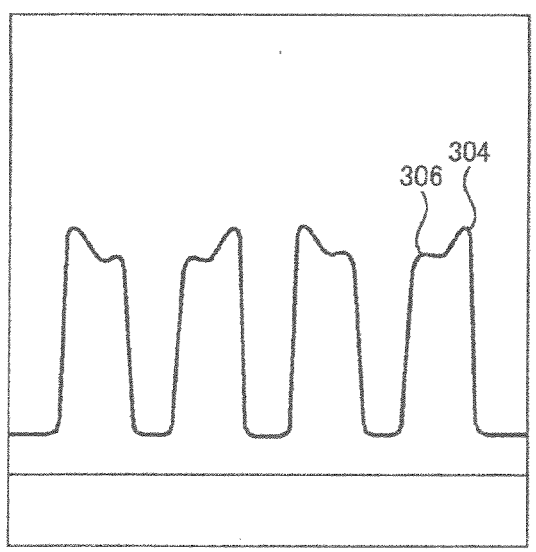
SECONDARY ELECTRON PROFILE OF PATTERN IN DIFFERENTIAL PROFILE OF SPACER PROFILE,
PROFILE OBTAINED BY TAKING ABSOLUTE
VALUES OF THE DIFFERENTIAL PROFILE FIG.7
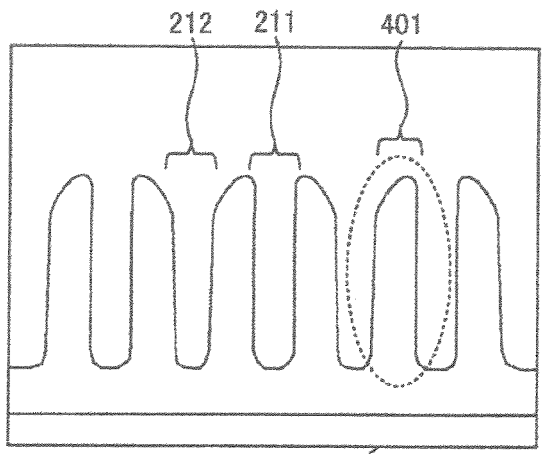
SECONDARY ELECTRON PROFILE OF PATTERN
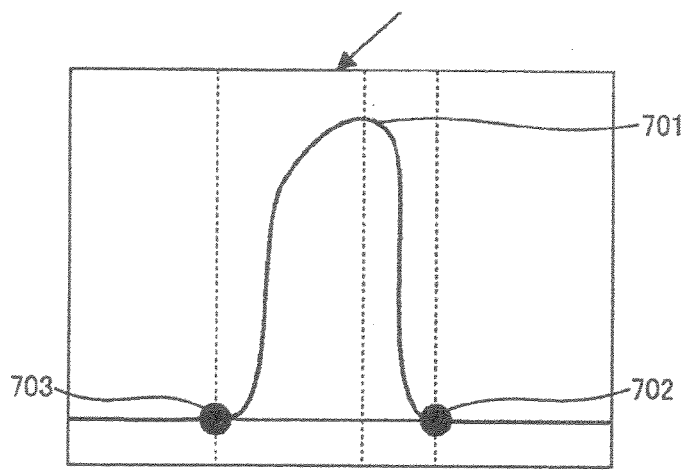
SECONDARY ELECTRON PROFILE IN ARBITRARY SPACER
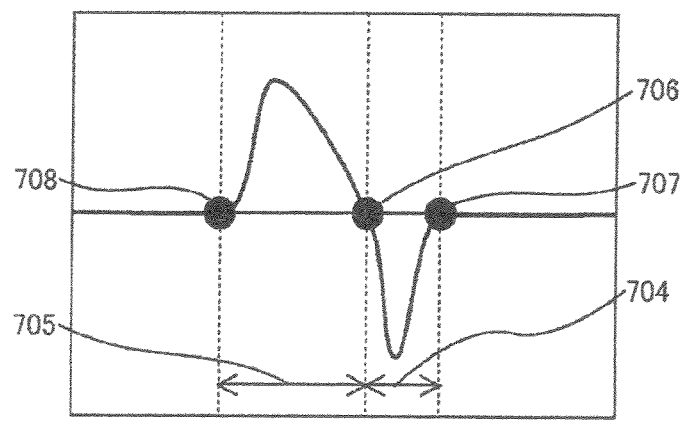
DIFFERENTIAL PROFILE OF SPACER PROFILE FIG.15
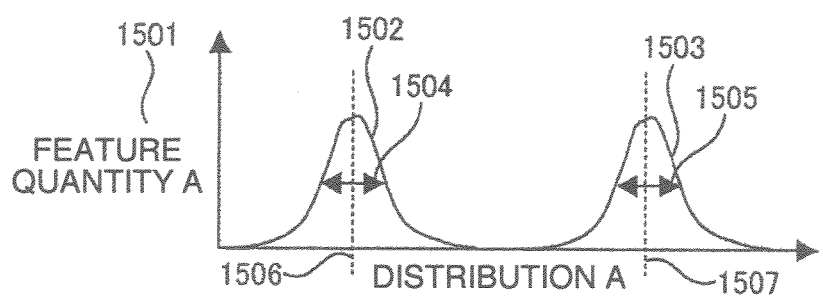
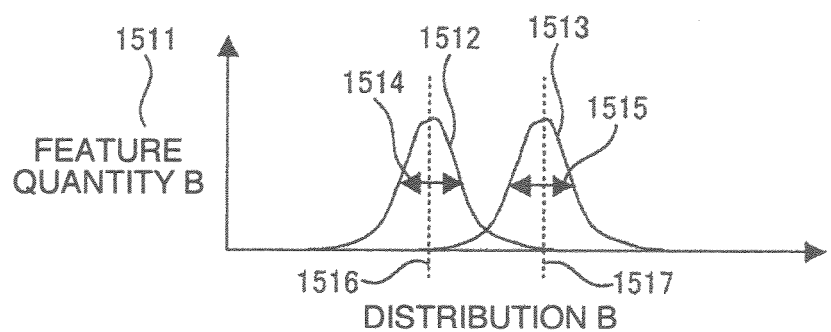
SECONDARY ELECTRON PROFILE OF OTHER SPACER PATTERN FIG.19
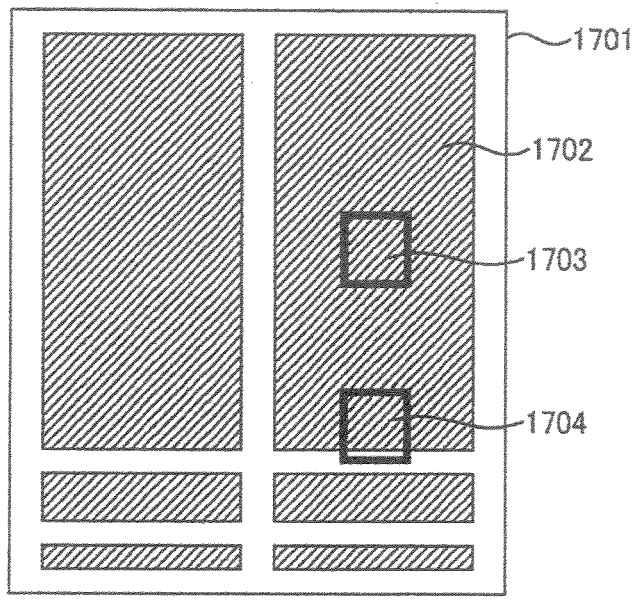
(a)
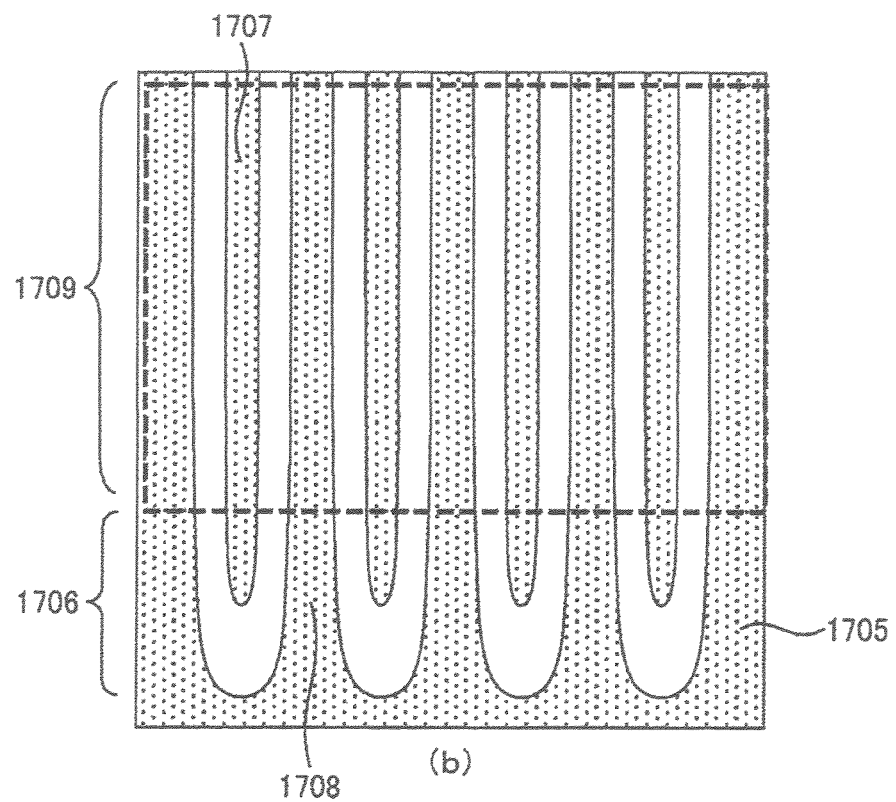
(b)

FIG.22
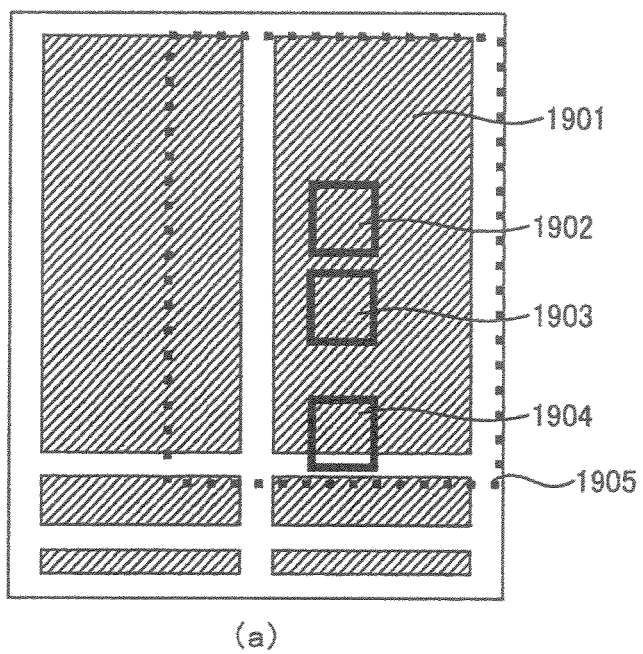
(a)
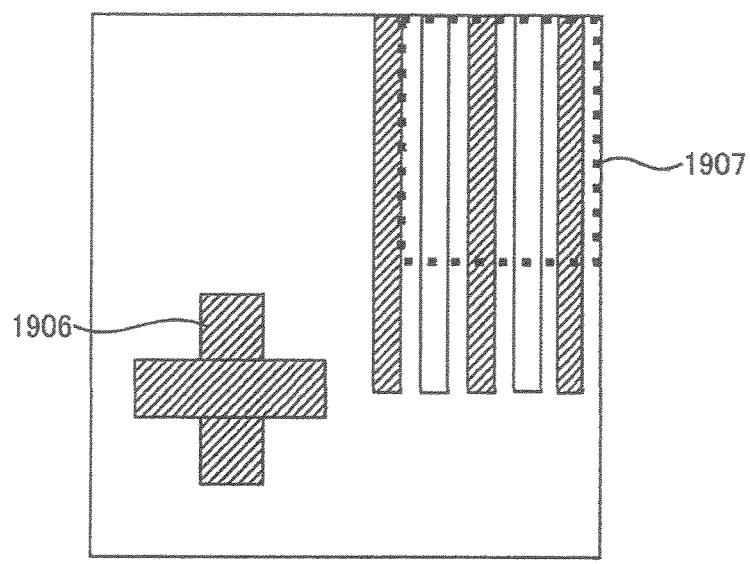
(b)

PATTERN MEASURING APPARATUS AND COMPUTER PROGRAM

RELATED APPLICATIONS

This application is the U.S. National Phase under 35 U.S.C. §371 of International Application No. PCT/JP2010/002524, filed on Apr. 7, 2010, which in turn claims the benefit of Japanese Application No. 2009-097572, filed on Apr. 14, 2009, the disclosures of which Applications are incorporated by reference herein.

TECHNICAL FIELD

The present invention relates to a pattern measuring apparatus for measuring pattern dimensions based on a signal obtained by irradiating a sample with a charged particle beam and, more particularly, to a pattern measuring apparatus adapted for measurement of patterns formed by double patterning.

BACKGROUND ART

A stepper (reduction projection exposure system) that is one semiconductor device fabrication apparatus is an apparatus that projects a pattern formed in a photomask, reticle, or the like onto a semiconductor wafer on which resist is applied while demagnifying the pattern by a projector lens.

Nowadays, as patterns have been manufactured with decreasing dimensions, a method of evaluating their performance by measuring or inspecting the formed pattern by a scanning electron microscope or the like is about to become the mainstream of semiconductor measurement and inspection. A scanning electron microscope is an instrument for imaging a sample by scanning an electron beam over the sample and detecting electrons released from the sample. That is, two regions emitting substantially the same amount of secondary electrons are represented by substantially the same brightness and so there is the possibility that it is difficult to discern the regions. Furthermore, if an electron microscope image is contaminated with noise, it might also be difficult to make such discernment. Especially, as patterns have been fabricated at higher levels of integration in recent years, patterns that are difficult to discern are found from time to time. Patent literatures 1 and 2 disclose techniques of discerning line patterns of a line-and-space pattern from spaces. In particular, patent literature 1 discloses a method of discriminating convex and concave portions of a line pattern made up of convex portions formed by two vertical inclined surfaces and one type of concave portion. Patent literature 2 explains a technique of judging whether a portion located between two peaks is a line pattern or a space based on a comparison of the peak widths of two adjacent profiles obtained by emitting a beam at an angle to an ideal optical axis.

Furthermore, if it is difficult to make a decision replying only on a two-dimensional image of a pattern, the type of the pattern can be identified by monitoring the three-dimensional morphology of the sample including the depth direction. Patent literature 3 discloses a method of estimating the three-dimensional morphology of a pattern as a method of observing a three-dimensional structure of the pattern by combining images observed from two different directions relative to a sample. Patent literature 4 discloses a method of measuring the dimensions of the top surface and bottom surface of a pattern separately by making a beam obliquely hit a pattern on the sample.

Non Patent literatures 1, 2, and 3 explain techniques for forming microscopic patterns in a semiconductor process by repeating exposure and etching, each twice.

CITATION LIST

Patent Literatures

Patent literature 1: JP-A-2004-251674
Patent literature 2: JP-A-2003-90719
Patent literature 3: JP-A-5-41195
Patent literature 4: JP-A-5-175496

Non Patent Literatures

Non patent literature 1: J. Finders, M. Dusa et al., "Double patterning for 32 nm and below: an update, "Proc. of SPIE Vol. 6924 692408-1-12
Non patent literature 2: A. Miller, M. Maenhoudt et al, "Comparison of LFLE and LELE Manufacturability, "5th International Symposium on Immersion Lithography Extensions, September 2008
Non patent literature 3: K. Lucas, C. Corkl et al, "Interactions of double patterning technology with wafer processing, OPC and design flows, "Proc. of SPIE Vol. 6924 692403-1-12

SUMMARY OF INVENTION

Technical Problem

In recent years, as patterns formed on a semiconductor samples have been required to be fabricated in decreasing sizes, a patterning method known as Self Aligned Double Patterning (hereinafter referred to as SADP) has been developed as one method of satisfying the requirement. It is forecast that pattern dimension measurement will be hereafter required between processes for improved production yield.

Gaps formed by different process steps are alternately formed between plural patterns formed by SADP. In order to appropriately perform process management or the like in various steps, it is necessary to make measurements after identifying the types of the gaps. Although a technique of discerning line patterns (convex portions) and spaces (concave portions) is described in patent literatures 1 and 2, it is not set forth that the same concave portions have different types. Also, there is no mention of a technique of discerning them. It is also conceivable to discern gaps by monitoring surface cross sections as disclosed in patent literatures 3 and 4. However, it takes labor to tilt the beam and to acquire plural images, which leads to increases in inspection time and measurement time. As a result, the number of samples that can be inspected or measured per unit time is reduced.

A pattern measuring apparatus is hereinafter described whose object is to permit the types of gaps formed by a fabrication process having plural exposure steps such as SADP to be identified with high throughput.

Solution to Problem

As one aspect for achieving the above-described object, a pattern measuring apparatus is proposed which extracts a quantity of features regarding one end side of a pattern including an arrangement of plural patterns and a quantity of features regarding the other end side of the pattern from a signal detected based on charged particle beam scanning and which discerns the types of spaces between the plural patterns based on a comparison of the two quantities of features.

As another aspect for achieving the above-described object, a pattern measuring apparatus is proposed which forms a profile of a pattern including an arrangement of plural patterns from a signal detected based on charged particle beam scanning, extracts portions of the profile giving signal values equal to or more than a given value, compares the profile of these portions with a previously stored profile, makes a decision as to whether there is a degree of coincidence equal to or more than a certain value, and discerns the types of space portions between the plural patterns based on the decision.

Advantageous Effects of Invention

According to the above-described configuration, discernment of the types of gaps formed by a manufacturing process having plural exposure steps such as SADP can be achieved while maintaining high throughput.

BRIEF DESCRIPTION OF DRAWINGS

FIG. 3 is a figure illustrating a cross section of a pattern formed by SADP, an electron microscope image, and a secondary electron profile.

FIG. 7 is a diagram illustrating a method of discerning gaps regarding a pattern having a reduced spacer linewidth.

FIG. 15 is a diagram illustrating a technique for discerning the types of gaps using plural quantities of features.

FIG. 19 is an explanatory view of an example of layout of a semiconductor chip and a model pattern.

FIG. 22 is a diagram illustrating a method of setting a model pattern in a case where a decision is made on gaps using two model patterns.

DESCRIPTION OF EMBODIMENTS

Figure 1:
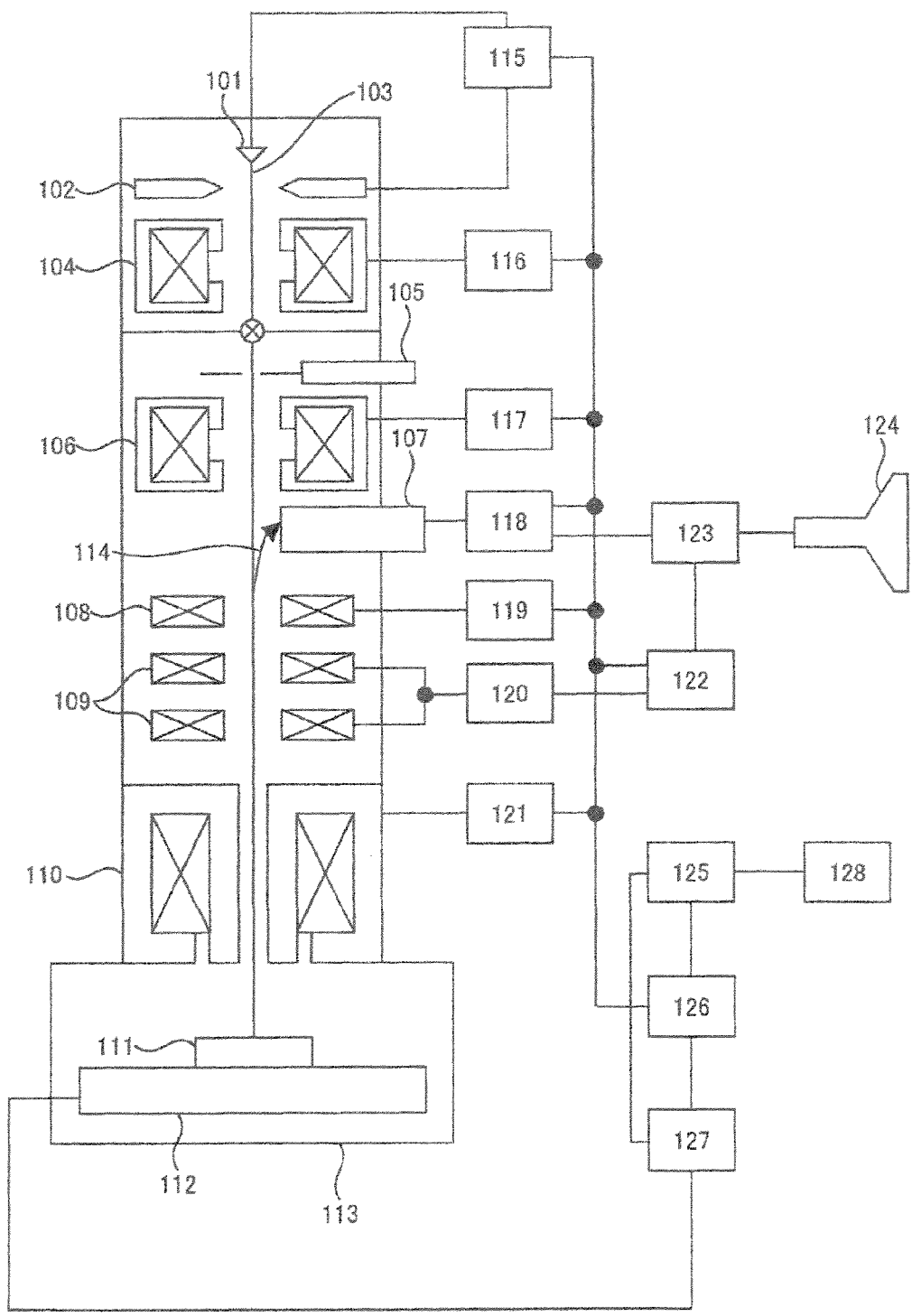
FIG. 1 is a schematic diagram of a scanning electron microscope.

SADP is a technique for creating a pattern formed by repeating lines and spaces arranged at a very narrow pitch less than the exposure limit reachable by the prior art exposure equipment.

In practice, a first mask pattern is formed by forming a first mask layer on a sample and etching the mask layer. A second mask pattern (hereinafter referred to as the spacers) is formed on only the sidewalls of the first mask pattern by forming a second mask layer on the first mask pattern and etching this mask layer. Then, the first mask pattern is etched away. Using the spacers remaining on the sample as a mask, the sample is etched to form a line pattern on the sample. Therefore, the dimensions of the spacers determine the dimensions of the line pattern formed on the sample. Accordingly, where a pattern is formed using SADP, it is quite important that the dimensions of the spacers be measured, the results of the measurement be fed back to a process determining the dimensions of the spacers, and the dimensions of the spacers be precisely controlled based on the results of the measurement.

Each spacer is made up of two side surfaces (first and second side surfaces) of different tilts and a top surface interconnecting the side surfaces. A first concave portion (hereinafter referred to as the core gap) adjacent to the first side surface of each spacer and formed by etching away the first mask pattern and a second concave portion (hereinafter referred to as the spacer gap) adjacent to the second surface of each spacer and formed by processing the second mask pattern by means of etching are present in the side surfaces of the spacers. The core gap and spacer gap are formed by different processes. The dimensions of the core gap and the dimensions of the spacer gap are controlled by the separate processes. Since the dimensions of these gaps determine the dimensions between line patterns during formation of the line patterns, in order to control the dimensions of the patterns, it is necessary that the spacers, core gap, and spacer gap be measured separately, that the values of the dimensions be fed back to the processes controlling the dimensions, and that conditions under which the processes are carried out be modified based on the values of the dimensions.

As described so far, in order to measure the spacers, core gap, and spacer gap separately, a function of discerning them is required.

Generally, a line pattern formed on a sample is so configured that lines are arranged at regular intervals. Therefore, the core gap and spacer gap formed by SADP are controlled so as to have the same dimensions. Accordingly, in an observation method in which a charged particle beam is made to impinge on a sample vertically, it is difficult to discern the gap from the taken image. Furthermore, the dimensions of a pattern formed by SADP are very small, as small as approximately 30 to 20 nm. Therefore, where the accuracy at which a two-dimensional movable stage for moving a wafer into a position where a measurement should be made is stopped is greater than the pattern dimensions, there is the possibility that the measurement range deviates. Consequently, whenever an image of a measurement point is taken, it is necessary to recognize the spacers, core gap, and spacer gap separately.

As described later, in an SADP process, core gap and spacer gap of a mask pattern are different in cross-sectional shape and so if these variations in shape can be sensed, two kinds of gaps can be discerned.

In an apparatus for measuring and inspecting semiconductor devices, it is desired that a number of patterns or the like formed on a sample be measured and inspected at high speed. Accordingly, decisions on gaps are required to be made at higher speeds.

In the embodiments described below, a technique of scanning a charged particle beam from a direction perpendicular to a pattern containing spacers formed on a sample and two kinds of gaps, detecting charged particles released from the scanned location to thereby derive a profile of the intensity of the charged particles, discerning the two kinds of adjacent gaps of different cross-sectional shapes based on a feature value calculated from the profile, and measuring the dimensions is described.

In order to discern the two kinds of gaps, the fact that the first and second side surfaces forming the spacer are different in shape is utilized. This difference in shape depends on the process that forms the gaps. The process in which the gaps are formed, i.e., the kinds of the gaps adjacent to the spacers, can be discerned by comparing the shapes. The shape of the side surfaces of the spacers appears as differences in signal height, in tilt of the tail portions of the profile, and in length of the tail portions in the profile of the intensity of the charged particle beam.

Specifically, where the tilt is steep, the peak height of the profile is great and the tilt of the tail portions is steep. The length of the tail portions short. Conversely, where the tilt is mild, the peak height of the profile is small, the tilt of the tail portions is mild, and the length of the tail portions is great. Based on these kinds of information, the gap adjacent to a steeply sloped side surface is judged as a core gap, while the gap adjacent to a mildly sloped side surface is judged as a spacer gap. By carrying out this on all the spacers, gaps within the measurement range can be discerned, and measurement of necessary pattern dimensions is enabled. Regarding a double patterning method other than SADP, in a case where two sets of patterns which are adjacent to each other and formed by different process steps are different in cross-sectional shape, variations in the cross-sectional shape appear as differences in profile of the intensity of charged particle beam and, therefore, the two sets of patterns can be similarly discerned, and the dimensions of the patterns can be measured.

The aforementioned technique makes it possible to measure dimensions continuously and automatically by discerning two kinds of gaps of different cross-sectional shapes in a pattern containing spacers formed by SADP and the two kinds of gaps without deteriorating the throughput.

A pattern measuring apparatus capable of discerning the types of space portions (gaps) formed between plural patterns based on a signal obtained by charged particle beam scanning is hereinafter described with reference to the drawings. In the following embodiments, an apparatus for measuring patterns based on a signal obtained by a scanning electron microscope (SEM) is described. Instead of SEM, a focused ion beam system can also be applied. However, in order to accurately measure patterns which have been diminished in size, quite high magnification is required. Generally, therefore, it is desired to use SEM that is superior to FIB equipment in resolution.

FIG. 1 is a schematic diagram of a scanning electron microscope. An overall controller 125 controls the whole apparatus via an electron optics controller 126 and a stage controller 127 based on an electron accelerating voltage entered by an operator from a user interface 128, information about a sample 111, information about the observation position, and so on.

The sample 111 is passed through a sample exchange chamber via a sample conveyer (not shown) and then held on a stage 112 present within a sample chamber 113.

The control optics controller 126 controls a high-voltage controller 115, a first condenser lens control portion 116, a second condenser lens control portion 117, a secondary electron signal amplifier 118, an alignment control portion 119, a deflection signal control portion 122, and an objective lens control portion 121 in accordance with instructions from the overall controller 125.

A primary electron beam 103 extracted from an electron source 101 by an extraction electrode 102 is focused by a first condenser lens 104, a second condenser lens 106, and an objective lens 110 and made to impinge on the sample 111. Along the way, the electron beam passes through an aperture 105. The orbit is adjusted by an alignment coil 108. The beam is scanned in two dimensions over the sample by deflection coils 109 that receive a signal from the deflection signal control portion 122 via a deflection signal control portion 120. Secondary electrons 114 released from the sample 111 owing to the irradiation of the sample 111 with the primary electron beam 103 are captured by a secondary electron detector 107 and used as a brightness signal for a secondary electron image display device 124 via the secondary electron signal amplifier 118.

Since the deflection signal of the secondary electron image display device 124 and the deflection signal of the deflection coils are synchronized, a pattern shape on the sample 111 is faithfully reproduced on the secondary electron image display device 124.

To create an image used for measurement of dimensions of patterns, a signal outputted from the secondary electron signal amplifier 118 is subjected to analog-to-digital conversion within an image processing processor 123, thus creating digital image data. Furthermore, a secondary electron profile is created from the digital image data.

A range measured from the created secondary electron profile is manually selected or automatically selected based on a given algorithm, and the number of pixels in the selected range is calculated. The actual dimensions on the sample are measured from the actual dimensions in the observed region scanned with the primary electron beam 103 and from the number of pixels corresponding to the observed range.

In the present embodiment, a computer including an image processing processor (decision portion) making gap decisions as described below based on a signal such as secondary signals gives an example of an apparatus constituting a part of a scanning electron microscope instrument as one example of the pattern measuring apparatus. Note that the apparatus is not restricted to this. For example, a gap decision as described later may be made by an external measuring apparatus having an interface for obtaining information (such as secondary electron signal, information on a signal waveform based on detection of secondary electrons, two-dimensional image signal, information on the contour lines of pattern edges extracted from an image, or the like) based on a signal acquired by a scanning electron microscope and an arithmetic unit equivalent to the above-described image processing processor. A program for performing processing (described later) may be registered on a storage medium and executed by a processor that supplies a necessary signal to the scanning electron microscope or the like. That is, the following description also explains either a program that can be executed by the pattern measuring apparatus such as a scanning electron microscope or a program product.

The SADP to be measured by the scanning electron microscope is schematically given below.

Figure 2:
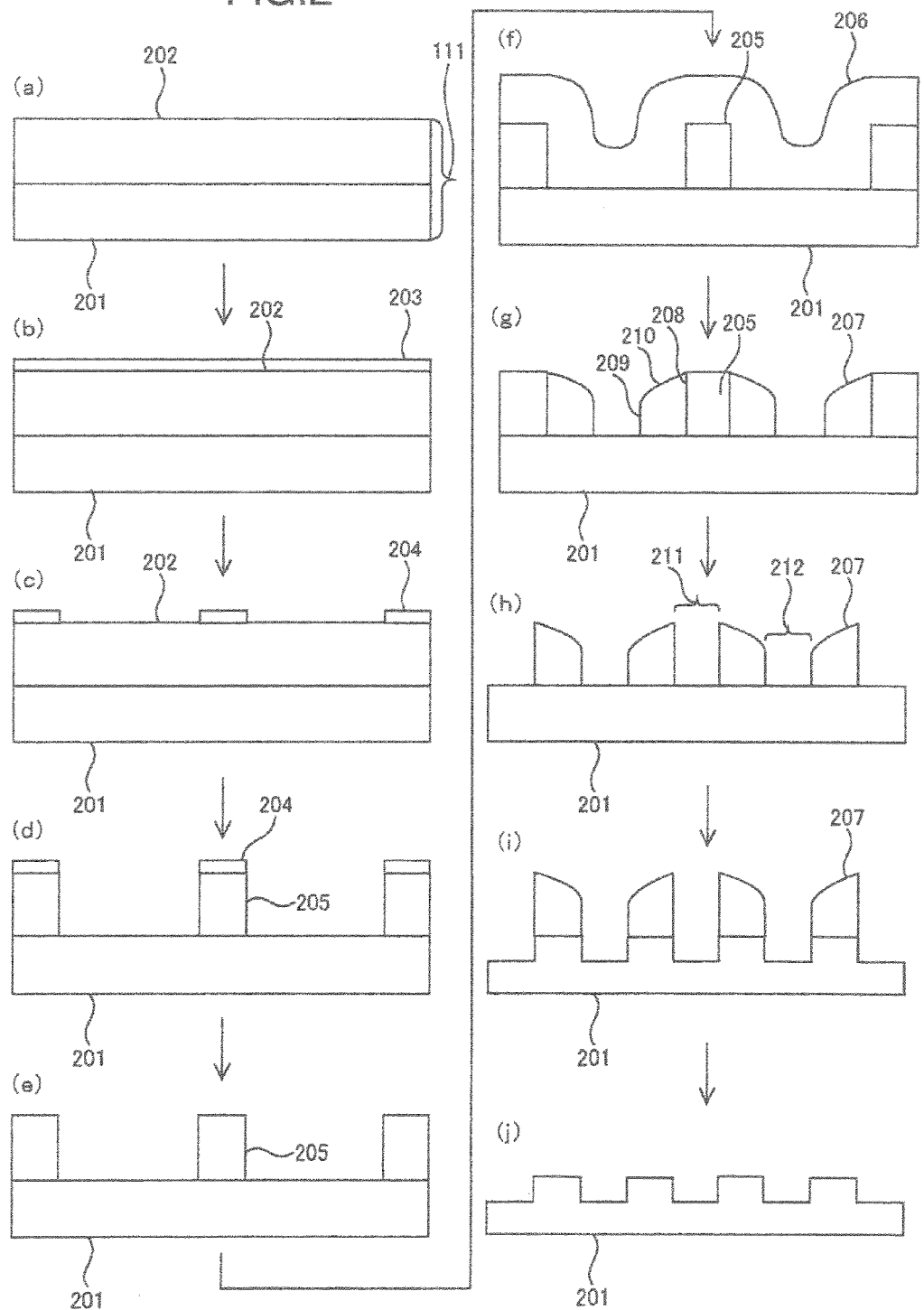
FIG. 2 is a diagram illustrating processing steps of SADP.

A fundamental process of SADP is shown in FIG. 2. In SADP, a first mask layer 202 is formed on a sample 201 for forming a pattern in the sample 111 (FIG. 2(a)). A photoresist film 203 is formed on the mask layer (FIG. 2(b)). The photoresist film 203 is exposed to a pattern and developed to form a photoresist pattern 204 on the photoresist film 203 (FIG. 2(c)). Using the photoresist pattern 204 as a mask, the first mask layer 202 is etched, forming a first mask pattern 205 (FIG. 2(d)).

Then, the photoresist pattern 204 on the first mask pattern 205 is removed (FIG. 2(e)). A second mask layer 206 is formed over the whole surface of the first mask pattern 205 (FIG. 2(f)). Subsequently, the etching conditions are so controlled that parts of the second mask layer 206 are left only on the sidewall of the first mask pattern 205, and the second mask layer 206 is etched (FIG. 2(g)). The residual structures of the second mask layer formed in this way are spacers 207.

The spacers 207 are so shaped as to be surrounded by a side surface 208 formed at the contact portion with the first mask pattern 205 and being vertical to the sample surface, a side surface 209 on the opposite side and sloping slightly relative to the side surface 208, and a top surface 210 slightly tilted from the side surface 208 to the side surface 209. Since the side surface 209 and top surface 210 are formed by etching the second mask layer 206 formed in conformity with the shape of the first mask pattern 205, the surfaces 209 and 210 are inclines mildly tilted around the first mask pattern.

Subsequently, if the first mask pattern 205 is etched away, only the spacers 207 remain on the sample (FIG. 2(h)). Finally, using the spacers as a mask, the sample is etched (FIG. 2(i)), forming a line pattern (FIG. 2(j)).

The dimension of the pattern finally formed on the sample 201 by the above-described process is determined by the dimensions of the spacers. The pitch dimension of the pattern is determined by the sum of the dimension of the concave portions between the spacers and the dimension of the spacers. However, the recessed portions between the spacers are composed of a core gap 211 formed by etching away the first mask pattern 205 and a spacer gap 212 formed by etching the second mask layer 206 after this mask layer is formed, i.e., two kinds. Therefore, if a difference is created between the core gap and spacer gap in dimension, the pitch dimension of the line pattern formed on the sample will not be constant. Accordingly, it is necessary that the values of dimensions be measured separately and fed back either to the process (FIG. 2(c)) for exposing the photoresist used to form the first mask pattern 205 to control the dimension of the core gap or to the film formation process (FIG. 2(f)) for forming the second mask layer 206 or the process (FIG. 2(g)) for etching the second mask layer 206 for controlling the dimension of the spacer gap. Then, the experimental conditions of the process need to be varied based on the values of dimensions.

A method of discerning the core gap and spacer gap formed on the sample by SADP using the scanning electron microscope and measuring the dimensions of the gaps is hereinafter described.

FIG. 3 shows an electron microscope image of a pattern containing spacers and two kinds of gaps formed on the sample, a cross section of the pattern corresponding to the electron microscope image, and a secondary electron profile created from the electron microscope image.

In this electron microscope image, there are portions 301 that have high brightness and appear white and portions 302 that have low brightness and appear black. The brightness of the electron microscope image depends on the amount of secondary electrons released from the sample and is characterized in that the brightness increases with increasing the amount of secondary electrons. By utilizing such a feature, differences in pattern cross-sectional shape appear as differences in image brightness in an electron microscope image. In the present embodiment, the core gaps and spacer gaps in the pattern are discriminated by utilizing their differences in shape and making use of such feature of the electron microscope image.

Those portions of the secondary electron profile created from the electron microscope image which correspond to the spacers are higher, whereas those portions which correspond to the gaps are lower. In addition, peaks of the secondary electron profile appear each at the boundary portion between a spacer and a core gap and at the boundary portion with a spacer gap, because when edge portions at different angles to the sample surface are scanned with an electron beam, the amount of emitted secondary electrons increases compared with a plane because of the edge effects. As the tilt of the edge becomes steeper, the amount of released secondary electrons increases.

Out of the two edges possessed by each spacer 211, the edge 303 adjacent to the core gap 211 is formed more sharply than the edge 305 adjacent to the spacer gap 212. Accordingly, comparison of a core peak 304 formed based on detection of electrons released from the edge 303 and a spacer peak 306 formed based on detection of electrons released from the edge 305 shows that the core peak 304 is relatively higher.

That is, at the boundary portion between the core gap 211 and spacer 207, the relatively higher core peak 304 appears. At the boundary portion between the spacer gap 212 and spacer 207, the relatively lower spacer peak 306 appears.

Before describing a method of making a gap decision in detail, other double patterning process is now described.

In the description made in connection with FIG. 2, an SADP process that is one double patterning process is taken as an example. Other various techniques have been proposed. For example, in a technique (Litho-Etch-Litho-Etch (hereinafter referred to as LELE)) as disclosed in non patent literatures 1 and 2, exposure and etching are repeated each twice to form microscopic patterns. In another technique (Litho-Freeze-Litho-Etch (hereinafter referred to as LFLE)), after exposing a first set of patterns, a second set is exposed while holding the first set of resist patterns by processing known as freezing. Double patterning processes other than SADP are characterized in that they are common in that adjacent patterns of high-density portions are divided into two masks and separately exposed twice.

Because adjacent patterns are formed through separate exposure processes, in order to manage and control the pattern dimensions, it is necessary to judge which of the exposure processes was used to form adjacent patterns. That is, adjacent line patterns need to be discriminated instead of core gap and spacer gap in SADP. In other words, a pattern edge adjacent to a core gap and a pattern edge adjacent to a spacer gap are different in process for fabricating edges. If the features provided by the manufacturing processes are captured, both can be discriminated.

The method of discerning differences in pattern cross-sectional shape based on differences in signal waveform from an electron microscope in the present embodiment can also be applied to such a general double patterning process. For example, as disclosed in non patent literature 3, in an LELE process, an example is shown in which by the effects of a first set of patterns initially formed by exposure and etching, the planarity of the initial layer deteriorates during exposure of a second set, making the exposure difficult. In this way, in the LELE process, the first and second sets of exposure are different in degree of difficulty. The resulting pattern shape varies dependently on the process for forming it. Also, in an LFLE process, the first set of exposure patterns is frozen. Light irradiation is again done in the second exposure processing. In this way, different processes are added. Therefore, it is highly likely that a shape different from the second exposure pattern is given. In either process, during the second exposure, the initial layer is affected by the first exposure and so the antireflection becomes insufficient. Therefore, the cross-sectional shape varies. Moreover, pattern shapes and dimensions vary relatively greatly. That is, the degree of line edge roughness (hereinafter referred to as the LER) is different between the first and second exposure patterns. Further, the image brightness varies dependently on the pattern shape as described previously. Additionally, the brightness of the electron microscope image varies according to the material. In an LELE process, the mask material for formation of the final pattern is different between two sets of patterns. Also, in an LFLE process, the material characteristics are varied between the two sets of patterns by freezing processing.

Regarding the SADP gaps, too, core gap and spacer gap are different in etching step of forming gaps. Therefore, it is highly likely that the state in which the surface has been damaged will be varied. In such a case, the brightness of the electron microscope image is varied by differences in material characteristics. In this way, in any double patterning process, two sets of patterns formed adjacently by different process steps have different shapes and produce different materials. Consequently, if they can be discerned by an electron microscope image, the pattern dimension can be evaluated during each fabrication process. This permits appropriate management and control of the fabrication process. In the following descriptions, a method of discerning patterns formed through an SADP process is described in detail. The method can also be applied to other double patterning processes by practical use of the technique.

Embodiment 1

Specific methods of discerning gaps are hereinafter described. Methods of discerning gaps are classified into two major types. A first method consists of noticing a difference in shape between secondary electron profiles produced by a difference in shape between two gaps and making discriminations based on values of features calculated from the profiles.

Figure 4:
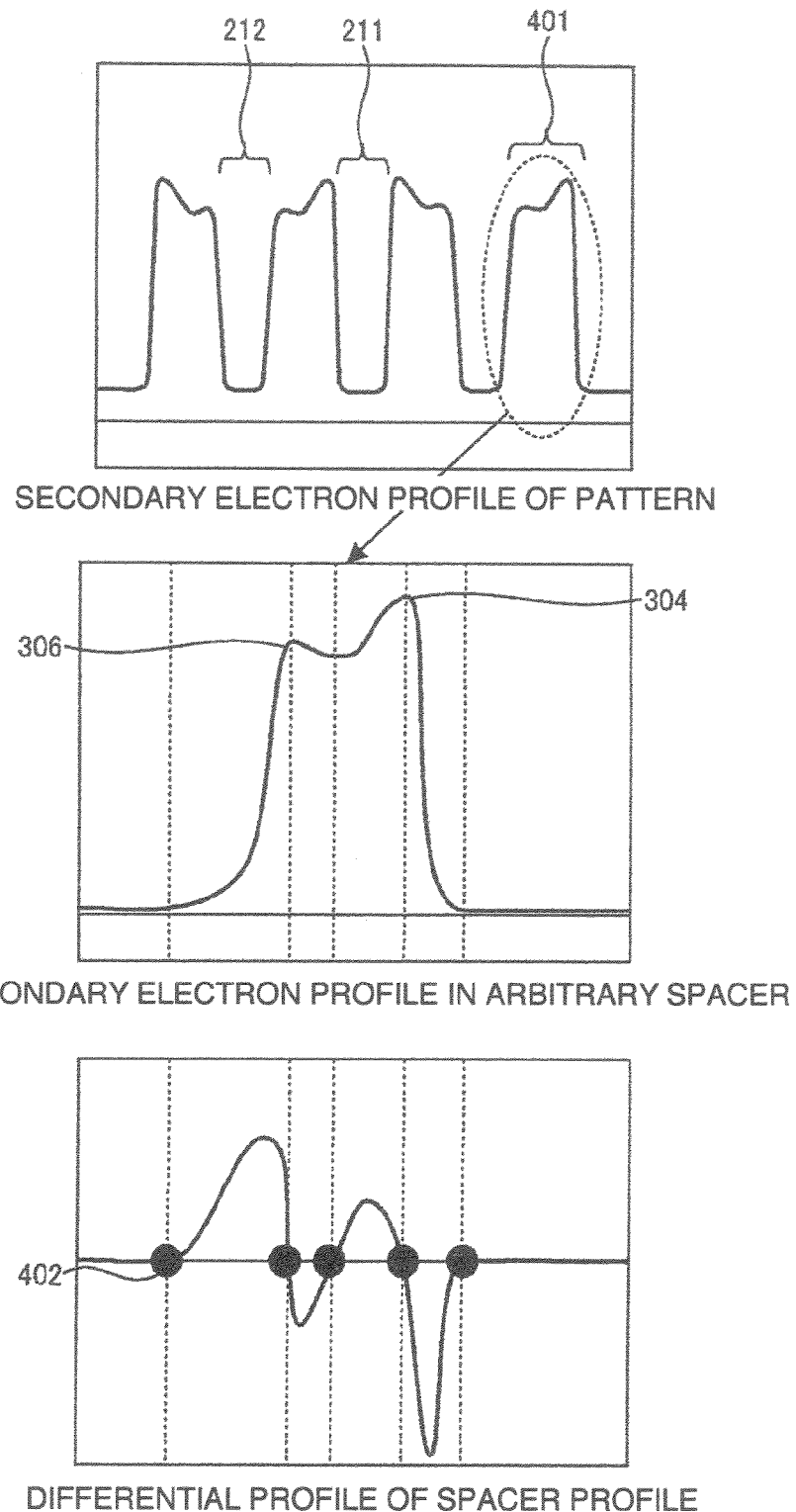
FIG. 4 is a diagram illustrating one example of technique for discerning the types of gaps based on a secondary electron profile.

FIG. 4 shows a secondary electron profile of a pattern containing spacers and two kinds of gaps, a secondary electron profile of an arbitrary spacer extracted from the profile, and a differential profile obtained by differentiating the profile.

First, a portion (hereinafter referred to as the spacer profile 401) corresponding to the spacer is extracted from the secondary electron profile of the pattern. In detecting the spacer profile 401, processing for extracting regions having amounts of secondary electrons equal to or higher than a preset threshold value is performed. Since the plural spacers are contained in the measurement range, each of the regions extracted by the processing is recognized as a separate spacer. The threshold value can be set at will, because the process is performed to separate spacers and gap portions from the secondary electron profile. Generally, the threshold value may be nearly midway between maximum and minimum values of the secondary electron profile of the pattern.

Then, a peak corresponding to a spacer edge is extracted from one extracted spacer profile 401. In extracting the peak, a method of using a differential profile of the spacer profile 401 is described. A differential profile is created from the spacer profile, and points 402 at which the value of the differential profile is 0 are extracted. One of the extracted points which gives the greatest value of the spacer profile is taken as the core peak 304, and one which gives the second greatest value is taken as the spacer peak 306.

After executing the above-described processing for all the spacer profiles 401, a region of adjacent spacer profiles in which core peaks 304 are adjacent to each other is judged as the core gap 211. A region in which the spacer peaks 306 are adjacent to each other is judged as the spacer gap 212.

Figure 5:
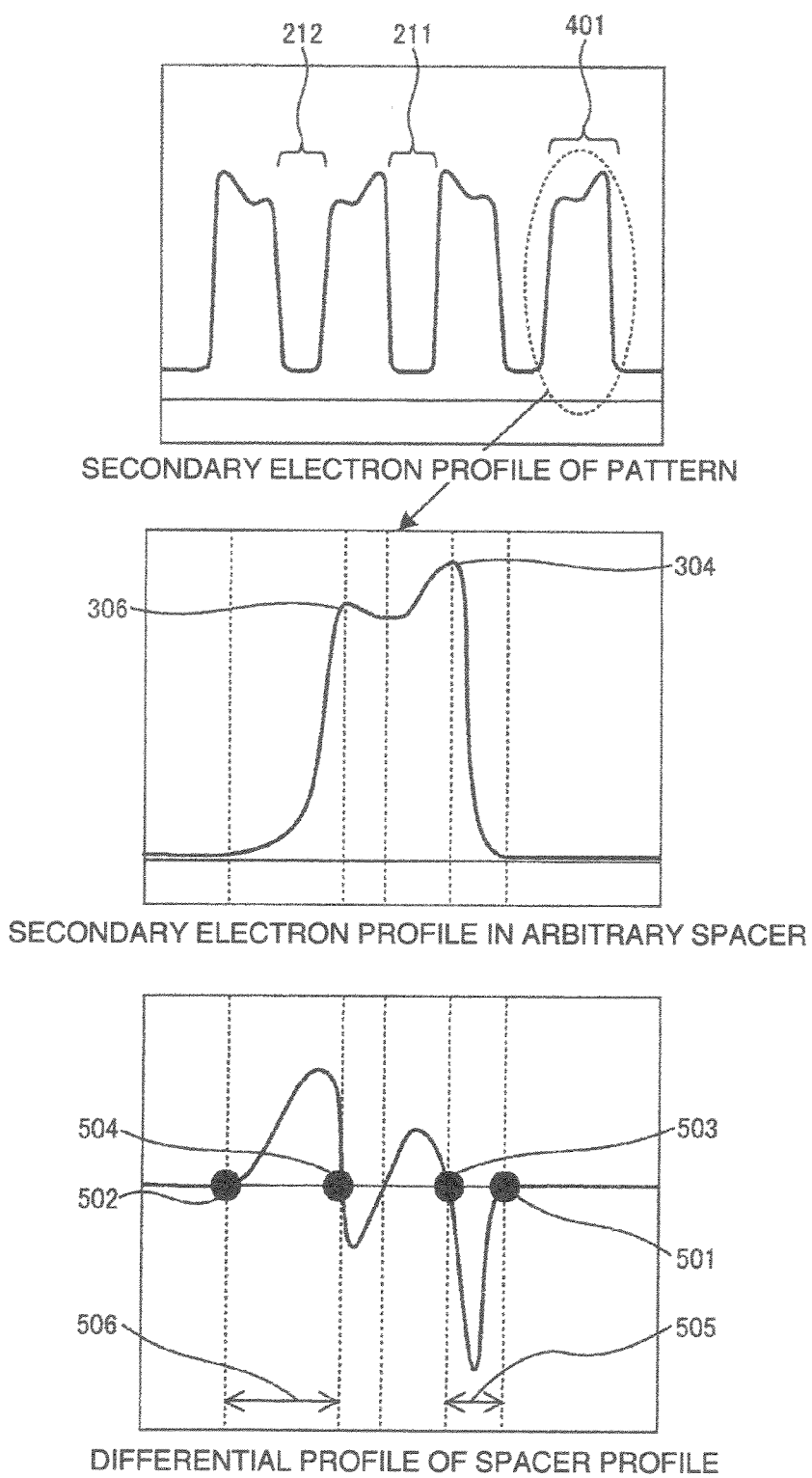
FIG. 5 is a diagram illustrating another example of technique for discerning the types of gaps based on a secondary electron profile.

As a discrimination method other than the foregoing, a discrimination using the tilt of the tail portions of the spacer profile 401 is also possible. FIG. 5 shows a secondary electron profile of a pattern including spacers and two kinds of gaps, an arbitrary spacer profile extracted from the profile, and a differential profile obtained by performing differentiating processing on the profile.

This method of discernment makes use of the feature that the tail portions of the spacer profile are long on a mildly sloped side surface and the tail portions of the spacer profile are short on a steeply sloped side surface, by paying attention to the fact that two side surfaces forming a spacer are different in tilt. In particular, the discernment is provided by comparing the distances from the rising of the spacer profile to the core peak 304 and to the spacer peak 306.

First, an arbitrary spacer profile 401 is extracted from the secondary electron profile of the pattern and then a differential profile of the profile is created in the same way as the foregoing technique. Left and right rising points 501, 502 of the spacer profile 401 are extracted from the differential profile. To extract the rising points, the value of the differential profile is scanned from an end point of the differential profile toward the center of the profile, and a point at which the value deviates greatly from 0 should be found.

Then, when going from the rising points 501, 502 toward the inside of the spacer profile, points 503 and 504 at which the value of the differential profile becomes 0 at first are extracted. As is obvious from FIG. 5, the positions of the points 503, 504 correspond to the core peak 304 and spacer peak 306, respectively.

Here, the two-point distance 505 between the points 501 and 503 and the two-point distance 506 between the points 502 and 504 are found. Comparison of the obtained distances between the two points makes it possible to judge that the gap adjacent to the side surface of the two-point distance 505 of greater value is the spacer gap 212 and that the gap adjacent to the side surface of the two-point distance 506 of smaller value is the core gap 211.

It is also possible to utilize only the tilt of the tail portions of the spacer profile. This is enabled by paying attention to the fact that two side surfaces forming a spacer are different in tilt, and makes use of the following. On a mildly sloped side surface, the tilt of the spacer profile is mild and so the absolute value of the differential profile decreases. Conversely, on a steeply sloped side surface, the tilt of the spacer profile is steep and so the absolute value of the differential profile increases.

Figure 6:
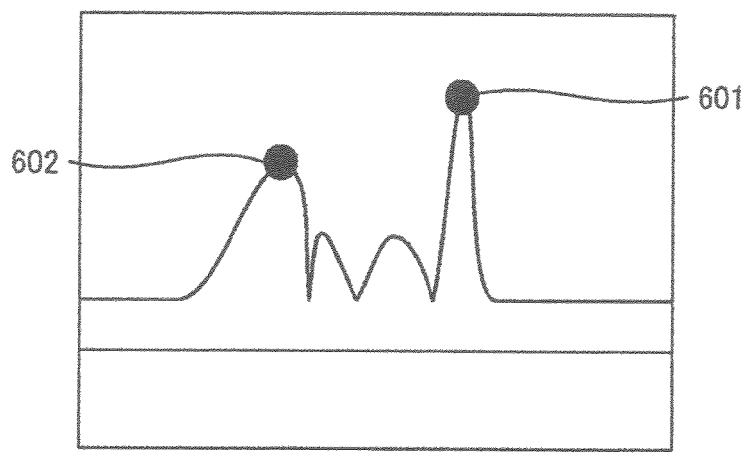
FIG. 6 is a diagram illustrating one example of differential profile of a spacer profile.

FIG. 6 shows a profile formed by taking the absolute value of the differential profile described in FIG. 5.

First, in the same way as the above-described technique, an arbitrary spacer profile 401 is extracted from a secondary electron profile of a pattern containing spacers and two kinds of gaps. Then, a differential profile of the profile is created. The absolute value of the differential profile is taken to create a differential profile. Subsequently, the peak heights of first peaks 601 and 602 in going from the left and right tail portions toward the center of the profile are compared. The gap adjacent to the peak 601 of greater height is judged as a core gap, while the gap adjacent to the peak 602 of lower height is judged as a spacer gap.

As a method of extracting peaks from a secondary electron profile, a method using a differential profile has been described in the present specification. The invention is also applicable to other method if it can extract peaks.

On the other hand, spacers of smaller dimensions may not show spacer profiles as shown in FIG. 4.

FIG. 7 shows a cross section of the pattern in a case where the spacer is smaller in dimension than the spacer shown in FIG. 4 and a secondary electron profile.

Where a finer pattern is formed using SADP, the dimension of the spacer decreases proportionately. If the dimension of the spacer decreases, the core peak and spacer peak approach toward each other. Therefore, it is forecast that the spacer peak will be hidden in the tail portions of the core peak and that the spacer peak cannot be detected as a peak. Otherwise, it is forecast that any clear difference between the core peak and the spacer peak cannot be detected, because the dimension of the formed spacer decreases to thereby reduce the difference in spacer side surface shape between the core gap side and the spacer gap side.

In this case, if decisions on gaps are performed by the foregoing technique, it is impossible to detect core gaps and spacer gaps. Accordingly, it is necessary to add processing for avoiding this error to a gap decision sequence.

Figure 8:
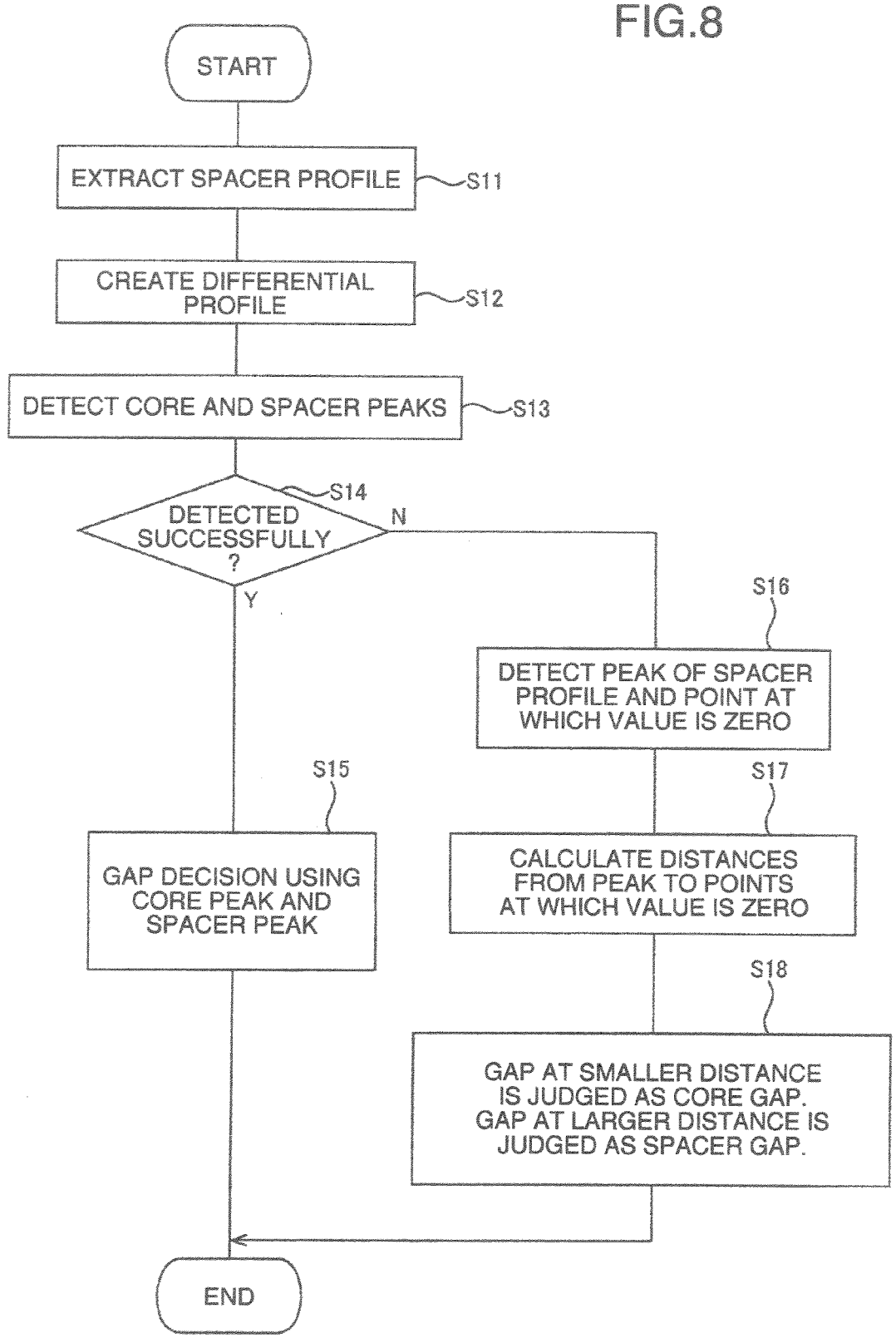
FIG. 8 is a flowchart illustrating process steps for discerning gaps regarding a pattern having a reduced spacer linewidth.

FIG. 8 is a flowchart to which the error avoidance processing is added.

Processing for detecting core and spacer peaks already described in the above-described gap decision method is performed on a secondary electron profile obtained from measurement points (S11, S12, and S13). In S14, a decision is made as to whether a core peak and a spacer peak have been detected successfully. In the secondary electron profile as shown in FIG. 7, only one peak is detected and, therefore, in the decision processing of S14, control proceeds to the processing of S16 rather than to normal gap decision processing (S15). In S16, a peak on the spacer profile is taken as one and a peak 701 is detected. Since the peak 701 is the sum of a core peak and a spacer peak, the position of the peak 701 is always present in a position close to the intrinsic core gap.

Accordingly, two-point distances 704 and 705 from the position of the peak 701 to the rising points 702 and 703 of the spacer profile are calculated in S17, and both are compared in S18. The smaller two-point distance is judged as a core gap, and the greater two-point distance is judged as a spacer gap. In the above-described technique, the two-point distance 704 between the points 706 and 707 and the two-point distance 705 between the points 706 and 708 can be compared by creating a differential profile from a secondary electron profile and computing points 706, 707, and 708 at which the values of the differential profile corresponding to the peak 701 and points 702 and 703 become null. Otherwise, the distance between peaks 701 in the space between adjacent spacer profiles 401 may be calculated, the gap at the smaller distance may be judged as a core gap 211, and the gap at the greater distance may be judged as the spacer gap 212.

Furthermore, core and spacer gaps can also be discerned by using either a discrimination method making use of the fact that the aforementioned LER is different between the left and right edges of a spacer or a discrimination method utilizing the fact that core and spacer gaps are different in bottom portion depth. These techniques will be described in detail in embodiment 2 described later.

As described so far, in a case where it has been determined that one gap decision method is not appropriate, the following advantageous effects can be expected by application of an algorithm that switches the method to other gap decision method.

For example, it is possible to cope with unexpected variations in the manufacturing process. In order to secure high yields in semiconductor device fabrication steps, it is important that the manufacturing process have stability and reproducibility as a further advantageous effect. The decision method needs to be switched. This requirement itself means that a variation in the process has been detected. Diffusion of an abnormality in the manufacturing steps can be prevented by causing a flag for the switching to be used for process quality checks (QC) and checking the process steps.

As described previously, as a method of making decisions on gaps formed between spacers, the kinds of the gaps can be identified accurately by using a profile formed based on electrons released from the spacer portions and comparing the quantity of features (information concerning peak heights, distance between a peak and a bottom (a point at which a peak rises), peak heights of a differential profile, the distance between the peak and bottom of the differential profile, and so on) on the side of one end (one edge) of the profile and the quantity of features on the side of the other end (other edge). Each of the two quantities of features is not restricted to the absolute distance between two points. For example, the quantities can be replaced by the number of pixels between two points in an image or some other value indicating the degree of the distance. Instead of directly comparing two quantities of features, a given reference value may be established and a decision may be made concerning to what extent the quantities are close to or apart from the reference value, thereby comparing the two quantities of features.

Figure 9:
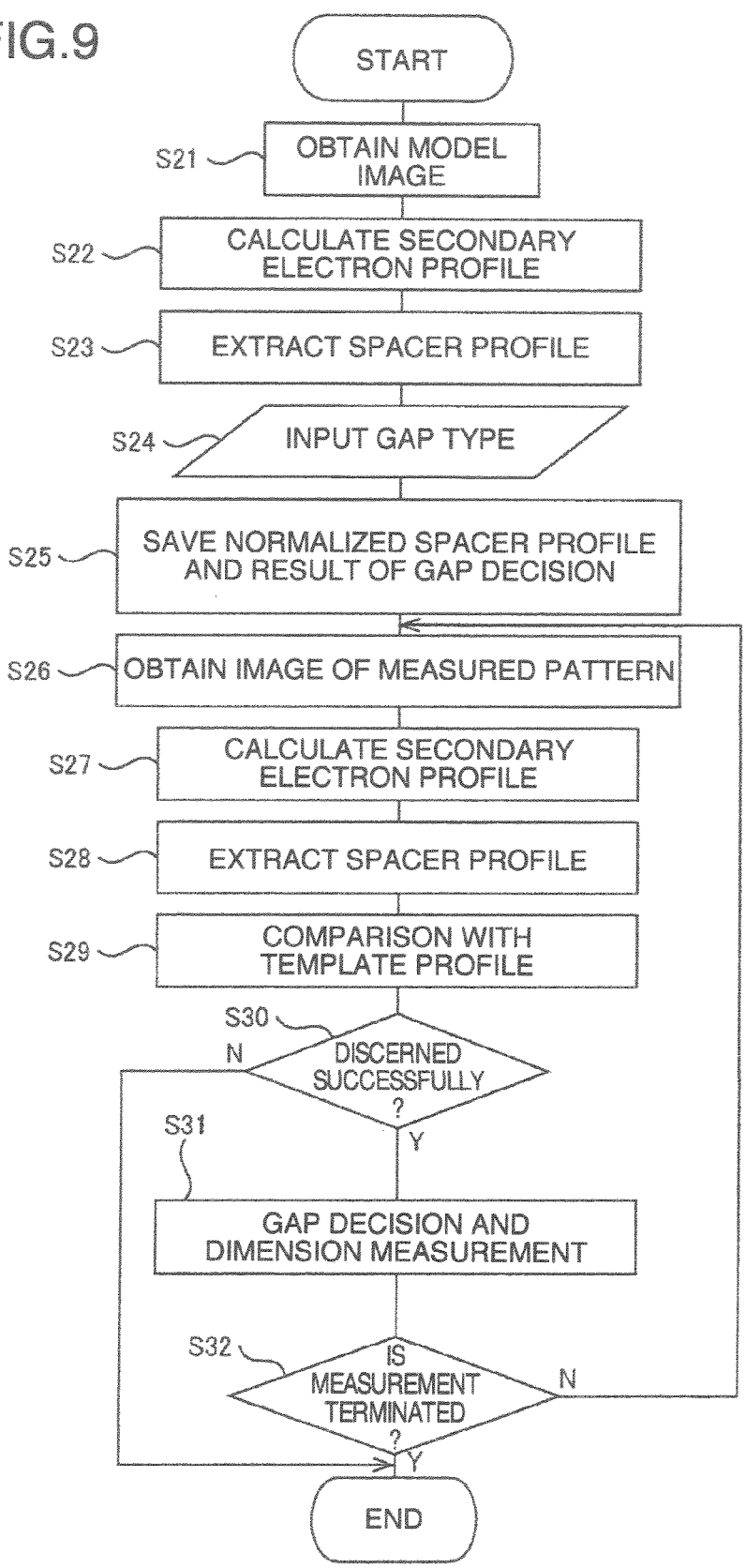
FIG. 9 is a flowchart illustrating process steps for discerning gaps by the use of waveform matching.

As a second gap decision method, a method of discerning gaps using profile matching is next described. A decision method relying on profile matching discerns gaps by previously registering a secondary electron profile of a pattern providing a reference for decisions and by calculating the degrees of similarity with secondary electron profiles obtained from patterns of measurement points. A flowchart of the decision method is illustrated in FIG. 9.

First, an operator performs manipulations to take an electron microscope image of a pattern having the same structure of a pattern to be discerned in a case where the positions of a core gap and a spacer gap in the pattern are already known (S21). A secondary electron profile is calculated from the image (S22). A region producing values of profile equal to or more than a given threshold value is automatically recognized as a spacer. The other portions are automatically recognized as gaps. A spacer profile is extracted (S23).

The region of the extracted spacer profile is divided into two gap portions and one spacer portion and displayed on the secondary electron image display device 124 of FIG. 1.

Then, the operator is asked to make inputs to determine what gaps correspond to core gaps and spacer gaps in S24 to determine the types of the gaps. In S25, the spacer profile is normalized using maximum and minimum values and registered as model information together with the types of the gaps adjacent to the profile. For this model registration, a pattern on the same wafer as the pattern to be measured and subjected to the gap decision processing may be used or a pattern obtained from a representative wafer may be used repeatedly for all subjects to be measured in S26 and the following steps. Where a registration is made for each wafer to be treated, the model and the measured subjects are comparable in pattern performance and so there is the advantage that discrimination can be made more precisely but operator's initial inputting is required. Regarding more efficient technique dispensing with this inputting will be described in embodiment 3. Measurements are carried out based on the model information registered as described so far.

In S26, a pattern of measurement points is imaged and a secondary electron profile is computed (S27). A region equal to or more than a given threshold value is automatically recognized as a spacer. The other portions are automatically recognized as gaps. A spacer profile is extracted (S28). In S29, the computed spacer profile is normalized and compared with a spacer profile of the registered model. Discrimination of gaps is carried out.

Figure 10:
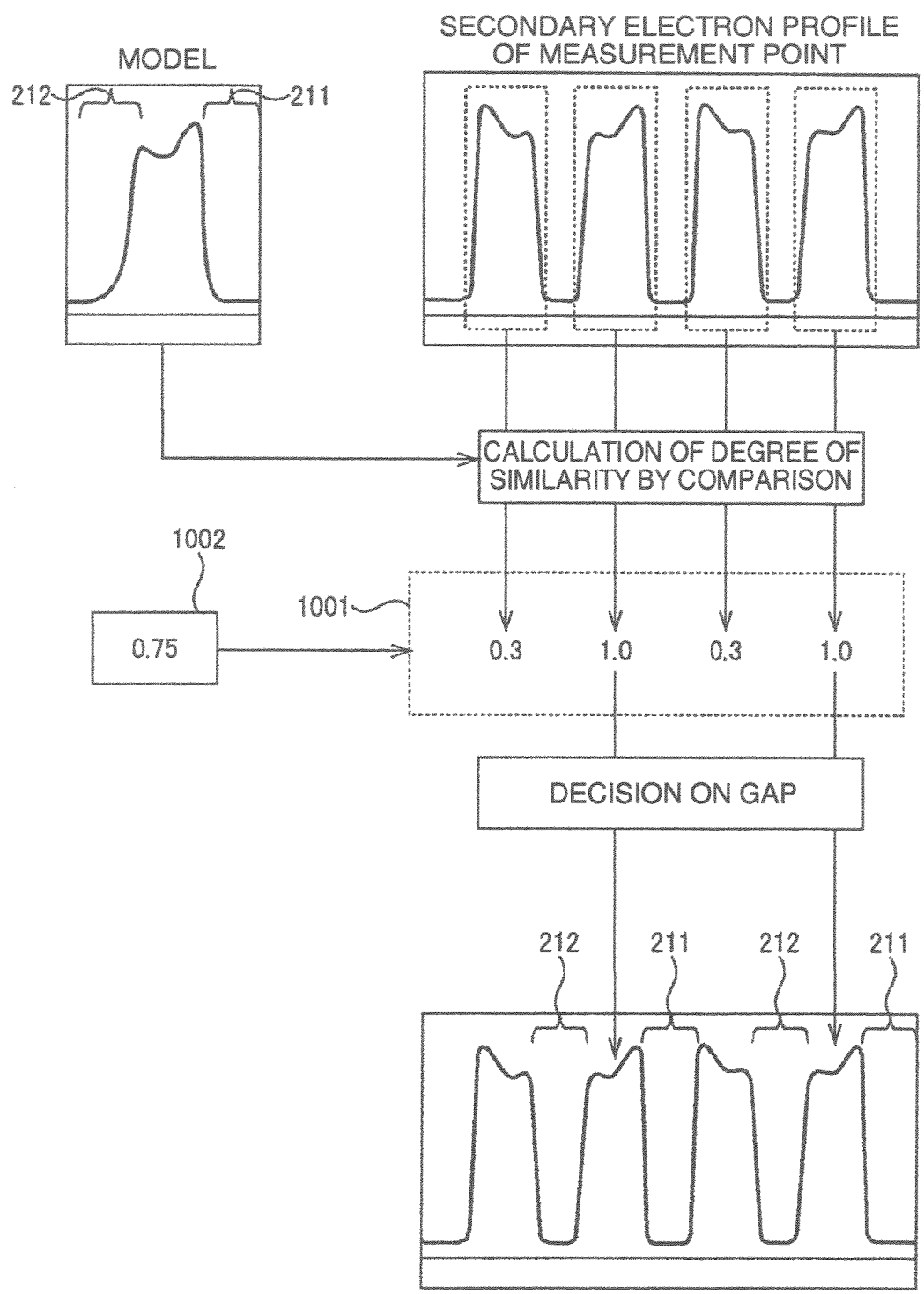
FIG. 10 is a diagram illustrating a method of discerning gaps employing waveform matching.

FIG. 10 particularly shows a gap decision method. First, a degree of similarity 1001 indicating to what extent each spacer profile obtained from measurement points agrees with the spacer model of the model is calculated. For convenience of the process, spacers directed left and right (i.e., different in sense) are alternately arranged and so spacers coincident in sense with the spacer profile of the model have high degrees of similarity. Conversely, spacers in the reverse sense have low degrees of similarity. Accordingly, a threshold value 1002 for a degree of similarity that permits extraction of only spacers coincident in sense with the spacer profile of the model is established. Gap decisions based on the model information are performed only on spacers having degrees of similarity equal to or higher than the threshold value. As described previously, core gaps and spacer gaps are alternately arranged. Consequently, the types of all gaps can be identified because of the processing described so far.

Furthermore, in this decision method using the model information, the decision can be performed using the values of features, which are employed in the first gap decision method, as model information.

In the above description of the gap decision method, decisions are performed on all spacer profiles existing in a measurement region scanned with a primary electron beam and the types of the gaps are identified. The number of spacer profiles on which decisions are made can also be reduced by utilizing the regularity regarding the arrangement of spacers, core gaps, and spacer gaps intrinsic to SADP.

This is because the types of gaps located between two corresponding spacers can be identified and the types of all the other gaps can be ascertained using those gaps as a reference by paying attention to the fact that core gaps and spacer gaps are formed so as to be always alternately arranged in a pattern containing spacers and two types of gaps and discerning two adjacent spacer profiles at minimum. The present technique makes it possible to reduce the number of decision processing steps. As a result, an improvement of throughput can be expected. However, where the number of spacers for which decisions are performed is reduced, if the spacers are out of shape, the possibility that the decisions are made unsuccessfully or erroneous decisions are made is high. Therefore, the operator may set at will the number of spacers for which decisions are made.

When decisions are made on plural spacer profiles, it is conceivable that some spacer profiles might be discerned unsuccessfully or erroneous decision results might be outputted. In this case, the obtained individual decision results can be totalized and decision results about gaps found to be in error because of the above-described regularity can be corrected.

Figure 11:
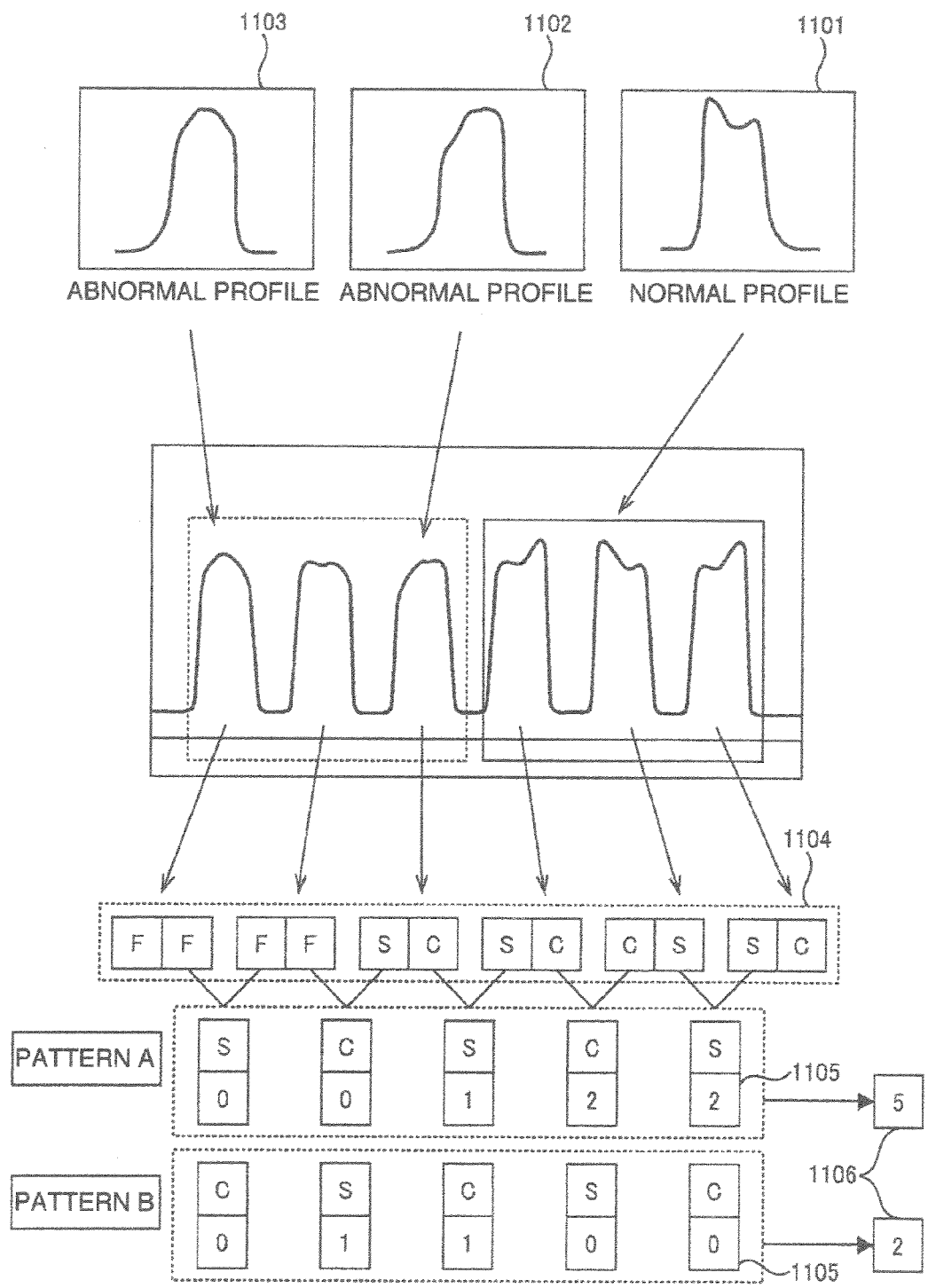
FIG. 11 is a diagram illustrating a method of correcting erroneous decisions when gap decisions are made.

FIG. 11 shows an error correction method when gap decisions are made. The secondary electron profile of measurement points shown in FIG. 11 contains a profile 1101 capable of being normally discerned, a profile 1102 liable to be erroneously discerned, and a profile 1103 liable to be discerned unsuccessfully.

First, spacer profiles are extracted from this secondary electron profile by the aforementioned technique. Left and right gaps of each of the spacer profiles are discerned. S of decision results 1104 denotes a spacer gap, C indicates a core gap, and F indicates that the decision is impossible to make. Core gaps and spacer gaps formed by SADP are always alternately arranged and so the pattern arrangement is either pattern A or pattern B. In the pattern A, the most leftward gap is a spacer gap. The pattern B is a core gap.

Then, an evaluation value 1105 of each gap when these two kinds of patterns are compared with the decision result of each spacer profile is calculated. A method of computing the evaluation value is as follows. If the result of decision agrees, the value is calculated to be +1, based on the decision result obtained from spacers on both sides of one gap. If the decision result is contrary or there is no result because of failure of the decision, the value is calculated to be 0. For example, the result obtained from the spacers on both sides agrees with the selected pattern, the value is +2. If only one agrees, the value is +1. After calculating evaluation values for all spacer profiles, an overall evaluation value 1106 obtained by totalizing the evaluation values of all the spacer profiles is calculated. Patterns giving high overall evaluation values are taken as gap decision results.

In the case of FIG. 11, the pattern A is the gap decision result. Based on the decision result, the decision results on gaps for which decisions were made unsuccessfully or erroneously are corrected.

Furthermore, at the stage of calculation of the overall evaluation value, in a case where the difference in overall evaluation value between the patterns A and B is equal to or below a given value, i.e., the proportion of spacers resulting in erroneous or unsuccessful decisions is equal to or higher than a certain value, the decision result at this measurement point is outputted as an error. Measurement of pattern dimensions at the present measurement point is not carried out. Control should go to the next processing, because when spacers resulting in erroneous or unsuccessful decisions increase in number, the reliability of the output decision result itself is low.

When discrimination of gaps and measurements end, the taken electron microscope image, gap decision results, and measured values of each gap are displayed on the secondary electron image display device 124 of FIG. 1.

Figure 12:
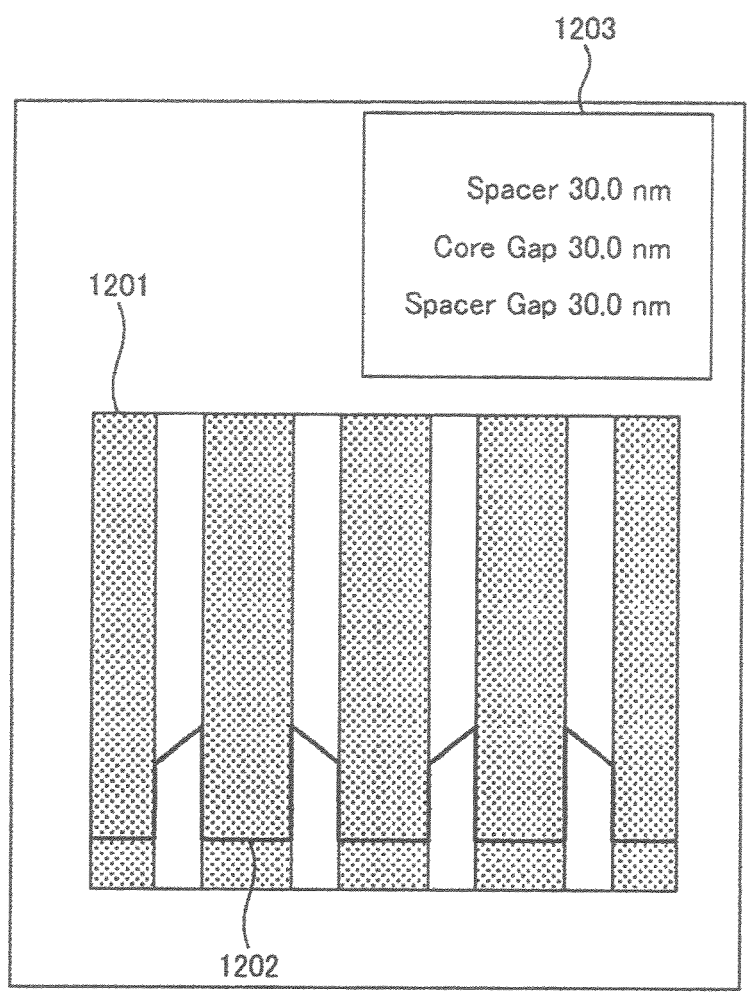
FIG. 12 is a diagram illustrating an example of display of the results of a measurement of core gaps and spacer gaps provided on an electron microscope image.

An example of display is shown in FIG. 12. A curved line 1202 in a lower portion of an electron microscope image 1201 displays a schematic cross section of a pattern subjected to a gap decision. Numerals 1203 at the top right of the electron microscope image 1201 display the average values of measured plural spacers, core gaps, and spacer gaps.

Because of the configuration described so far, it is easy to make a gap decision on a pattern containing spacers and two types of gaps in a range scanned with a charged particle beam only from an image taken from a vertical direction. Furthermore, where incorporated in automatic measurement of semiconductor inspection equipment, the processing for making decisions on gaps permits inspections and measurements to be carried out without deteriorating the throughput.

Embodiment 2

Figure 13:
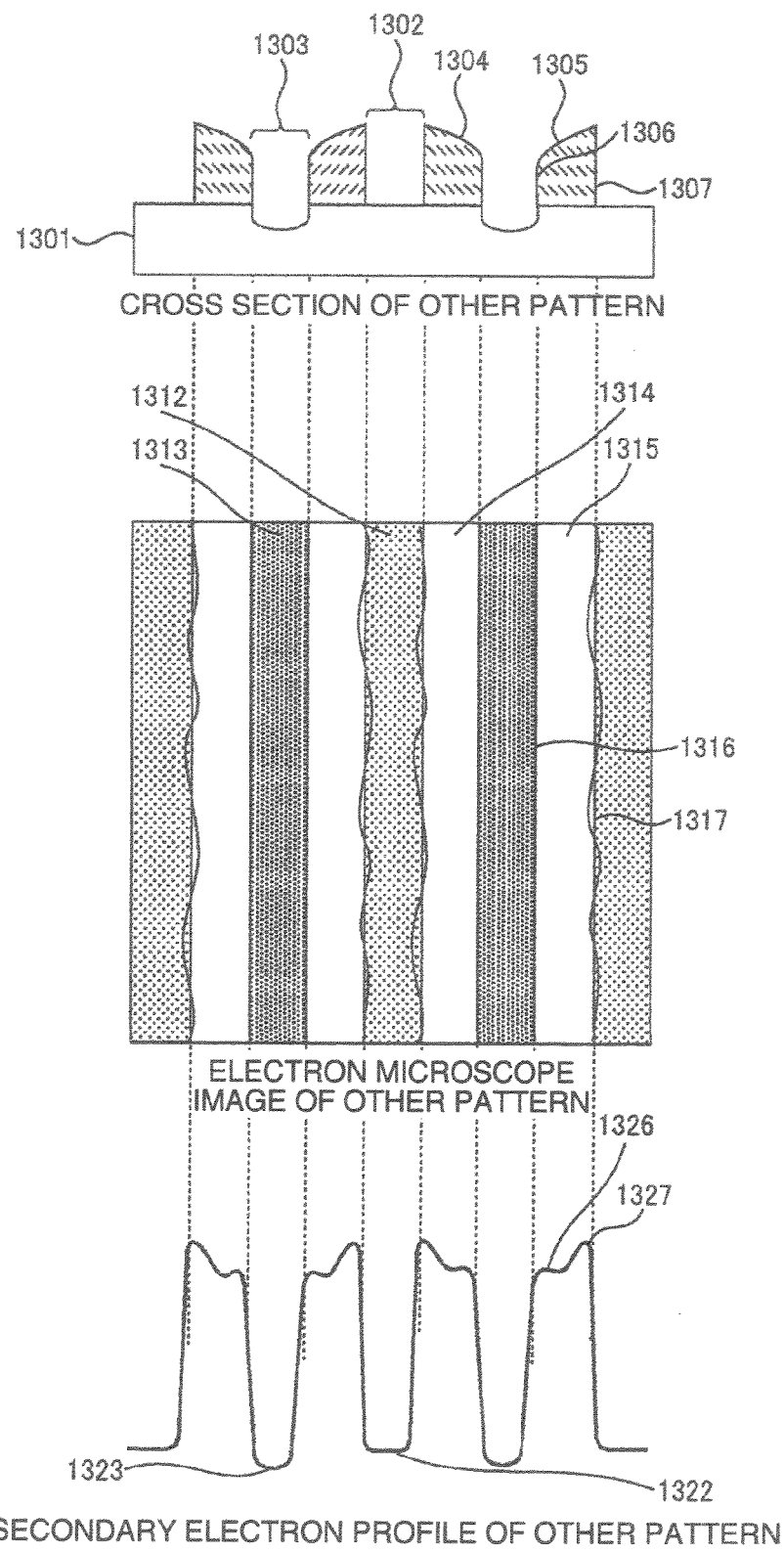
FIG. 13 is a figure illustrating other examples of cross section of a pattern formed by SADP, electron microscope image, and secondary electron profile.

FIG. 13 shows an example of pattern different from the pattern described in connection with FIG. 3. An electron cross section of the pattern formed on a sample, a cross section of a pattern corresponding to the electron microscope image, and a secondary electron profile created from the electron microscope image are shown. The difference with FIG. 3 is that there is a difference in depth between spacer gap 1303 and core gap 1302. In the present embodiment, the spacer gap 1303 has been etched more deeply than the core gap 1302. It is considered that such a difference tends to be exhibited because the spacer gap 1303 and core gap 1302 have been formed by separate etching processes as shown in FIG. 2. The differences are observed as brightness variations in the electron microscope image. For example, a spacer gap portion 1313 is darker, while a core gap portion 1312 is brighter. In the secondary electron profile, they appear as differences in depth of the bottom portion of the waveform. The profile 1323 of the spacer gap portion is deeper than the profile 1322 of the core gap portion. A spacer gap side 1326 and a core gap side 1327 can be determined and decisions can be made on the left and right (1304, 1305) of the pattern of interest by detecting those differences.

Other differences caused by the fact that the spacer gap 1303 and core gap 1302 have been formed by separate etching processes are differences in line edge roughness. On the core gap side, the line edge roughness when core gaps are formed remain as it is. It is considered that on the spacer gap side, the line edge roughness is small because the spacer gap is formed by etching. A method of making decisions on left and right patterns using the difference is described by referring to FIG. 14. The line edge roughness 1316 on the spacer gap side is herein referred to as left line edge roughness, while the line edge roughness 1317 on the core gap side is referred to as right line edge roughness.

Plural secondary electron profiles 1402 are created for each arbitrary region 1401 projected when a secondary profile is created from an electron microscope image of a pattern. All line edges of these secondary electron profiles 1403 are detected. For example, detection of each line edge can be so determined that it is in a position midway between maximum and minimum values of the secondary electron profile of each pattern. In an edge image 1411 obtained by plotting edges detected from every region, two lines 1412 on the core gap side and two line edges 1413 on the spacer side are alternately arranged. Then, the distribution of line edge positions at the edges is found. The difference in line edge roughness between the core gap side and the spacer side can be discerned from the difference between the distribution 1422 of line edge positions on the core gap side and the distribution 1423 of line edge positions on the spacer side.

Figure 14:
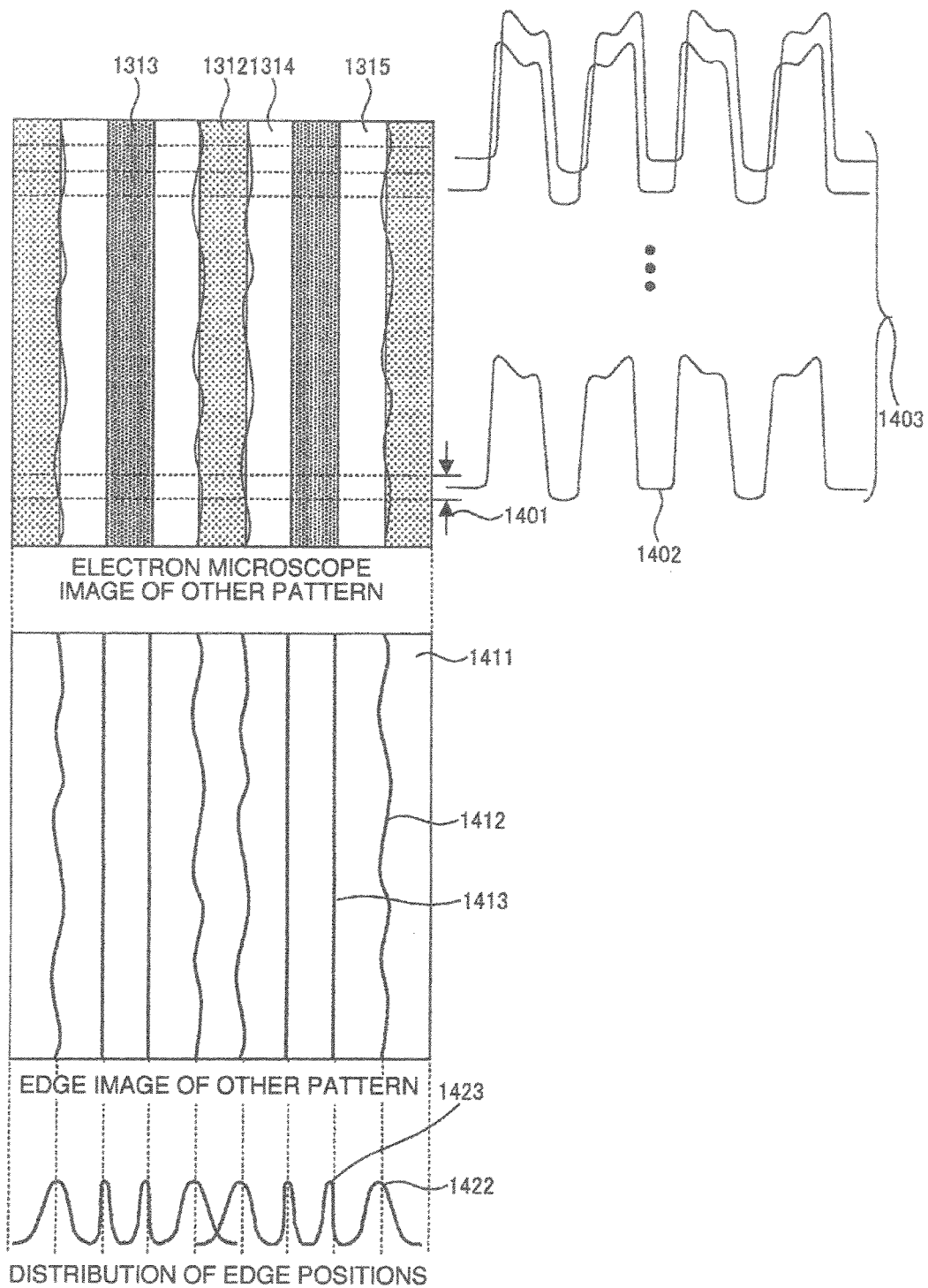
FIG. 14 is a figure illustrating a technique of finding edge fluctuations from a secondary electron profile obtained from plural regions within an area (field of view) scanned with a beam.

Information about the distribution of edge positions can be acquired based on acquisition of information about edge positions in the lateral direction (X direction) obtained at plural different edge positions in the vertical direction (Y direction) of the paper of FIG. 14. For example, a graph whose lateral axis indicates the information about edge positions and whose vertical axis indicates the frequency at which a signal appears is created. It is conceivable to make gap decisions based on the information about edge position distribution represented on the graph. In this case, the half-value width of the distribution curve is compared between first and second gap portions. One with larger half-value width is judged as an edge on the core gap side (one with smaller half-value width is judged as an edge on the spacer gap side).

Besides, roughness may be evaluated, based on a technique of evaluating fluctuations of general line segments. A gap located on the side of a line segment with a larger amount of fluctuation may be judged as a core gap (a gap located on the side of a line segment with a smaller amount of fluctuation may be judged as a spacer gap).

Alternatively, in a different Y-direction position, a brightness profile may be formed. A contour line may be formed by splicing together portions having a given brightness, and fluctuation of the contour line may be evaluated. In addition, vector data on the contour line can be stored in the same format as design data about semiconductor devices such as GDS or OASIS format.

Plural features for discriminating left and right patterns have been proposed so far. Each of these plural quantities of features can be used for decisions alone or in combinations. The advantage arising when they are used in combination is that it is impossible to make a decision as to what feature quantity is advantageous in recognizing left and right spacers, because each individual customer is different in process of creating a pattern. In FIG. 15, to illustrate a method when plural quantities of features are used for decisions, two quantities of features A (1501) and B (1511) are first considered. For example, two quantities of features are a variation in height between left and right edges of a secondary electron profile and a variation in depth between core gap and spacer gap.

For the sake of illustration, the feature quantity A (1501) is taken as a variation in height between left and right edges. The feature quantity B is taken as a variation in depth between core gap and spacer gap. In the feature quantity A, a distribution 1502 indicates a distribution (average value 1506 and variance 1504) of edge heights on the spacer gap side. A distribution 1503 indicates a distribution (average value 1507 and variance 1505) of edge heights on the core gap side. Similarly, in the feature quantity B, a distribution 1513 indicates a distribution (average value 1517 and variance 1515) of depths of spacer gaps. A distribution 1512 indicates a distribution (average value 1516 and variance 1514) of depths of core gaps. Where a classification is made using quantities of features, a reliable decision may be made when two distributions are apart. Furthermore, a better result is obtained when the variance is narrow. It is assumed here that a distance is obtained by subtracting the average value 1506 from the average value 1507 of each distribution. Comparison of the feature quantities A and B shows that their variances are equivalent but it is determined that the feature quantity A having a larger distance is better.

The case where two or more quantities of features are used is fundamentally the same. Their feature quantities are stored as numeric data when patterns are registered. The data can also be used when a pattern detection is carried out.

Figure 16:
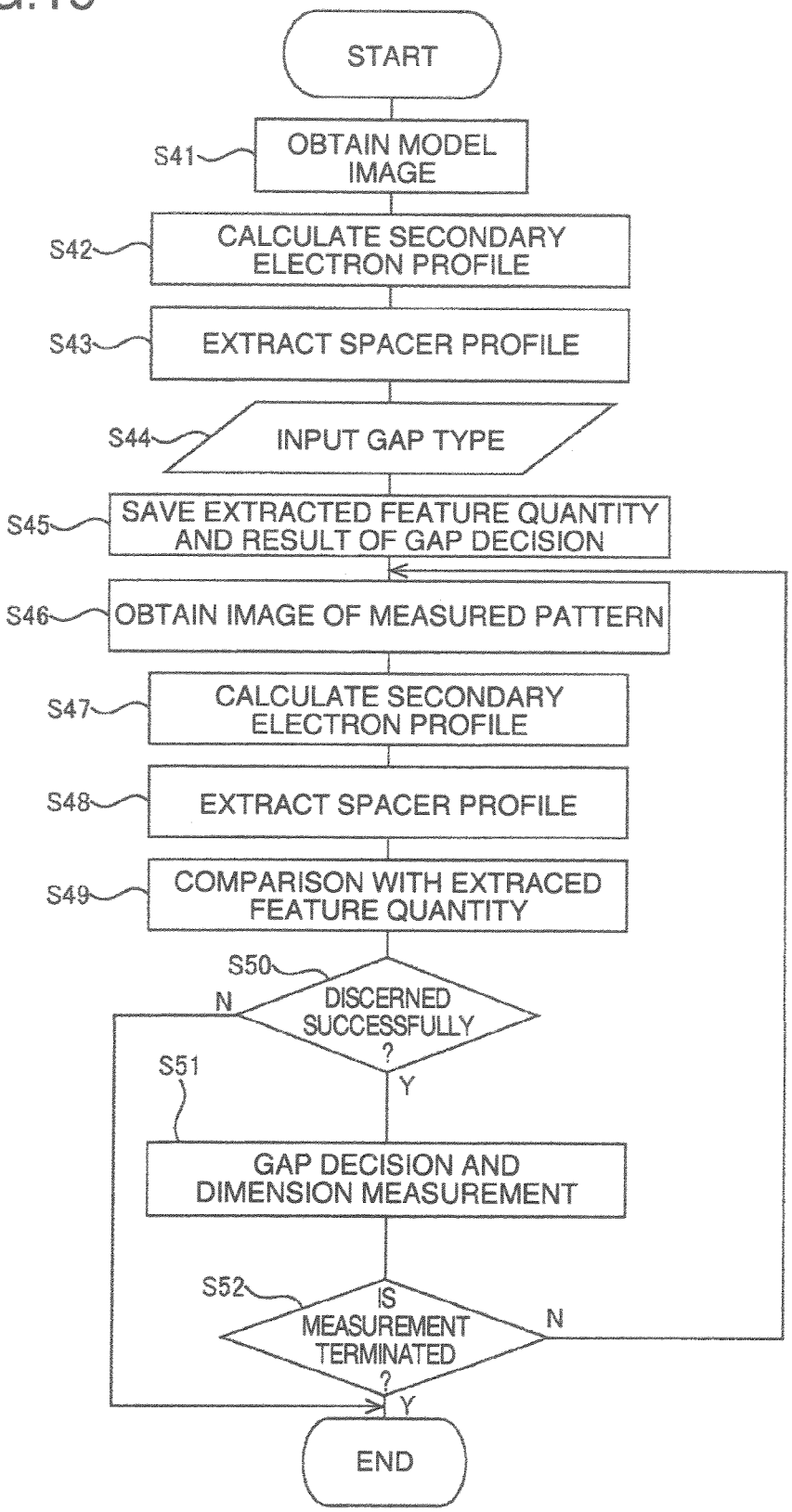
FIG. 16 is a flowchart illustrating a gap decision process using a model pattern.

A flow of a sequence obtained by replacing the sequence of the embodiment of FIG. 9 by the present embodiment is shown in FIG. 16. In the embodiment of FIG. 9, an example in which a gap decision is made using template matching is shown. In the present embodiment, quantities of features extracted from a model image are compared, and gap decisions are made (S45). In other respects, in the same way as the sequence of FIG. 9, a model image is acquired (S41), a secondary electron profile is calculated (S42) from the image, and a spacer profile is extracted (S43). The human operator makes an input of gap types (S43). The result of a decision relying on comparison of feature quantities is saved and then an image of a pattern actually measured is acquired (S46). In the same way as for the model image, a secondary electron profile is calculated (S47) and a spacer profile is extracted (S48). They are compared with the saved quantities of features (S49). If the gaps are discerned successfully (S50), a dimension measurement is performed for each gap type based on the decision result (S51). If there are other measurement points, an image of a pattern to be measured newly is acquired. The sequence of S46-S51 is repeated as many times as there are measurement points (S52).

Embodiment 3

Figure 17:
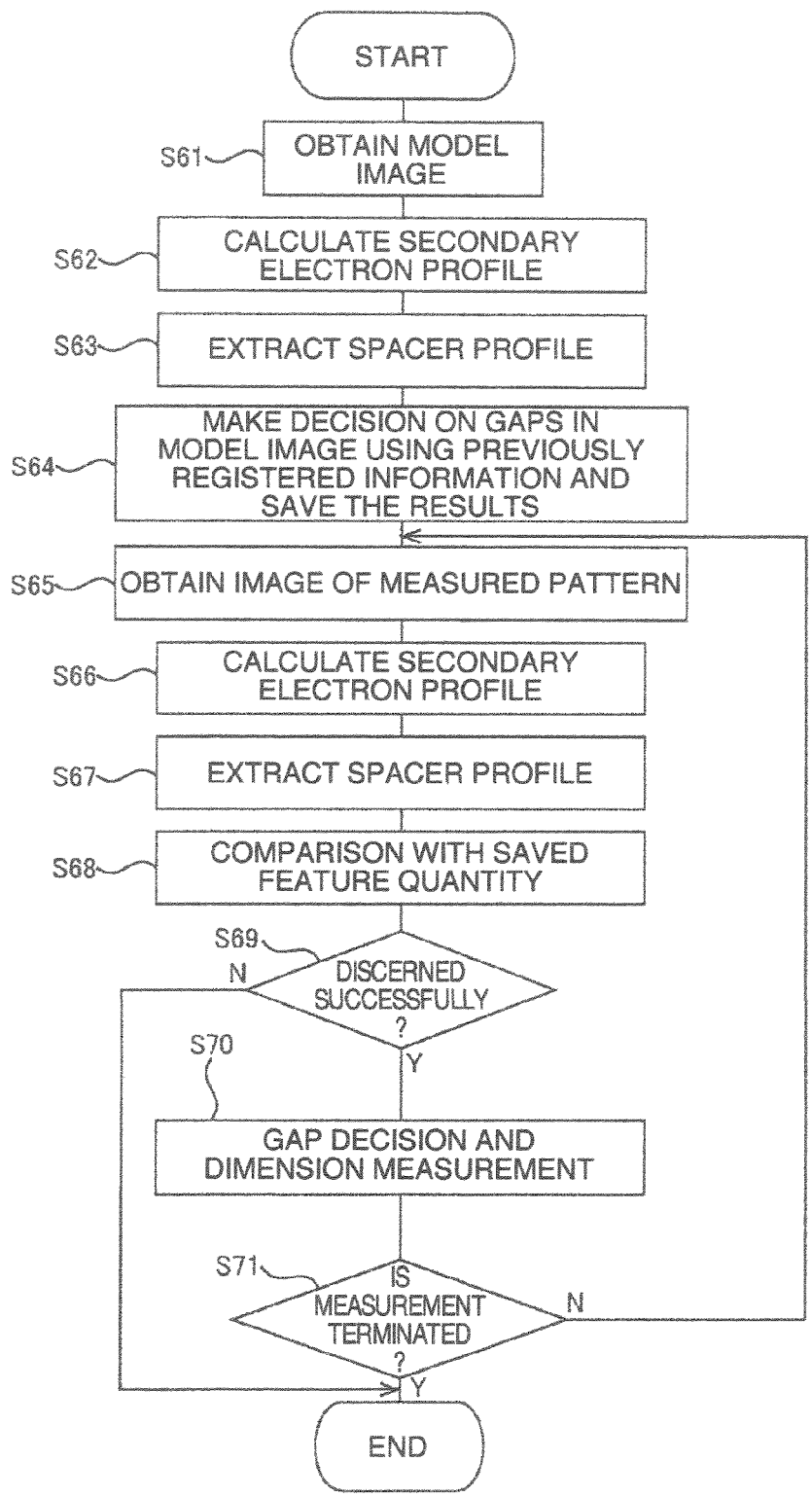
FIG. 17 is a flowchart illustrating a process for discerning gaps by creating a model pattern on the same sample as a pattern to be discerned and using quantities of features obtained from a profile of the model pattern.

A method of automatically obtaining the model image (FIG. 9) for each wafer to be measured is described by referring to FIG. 17.

Figure 18:
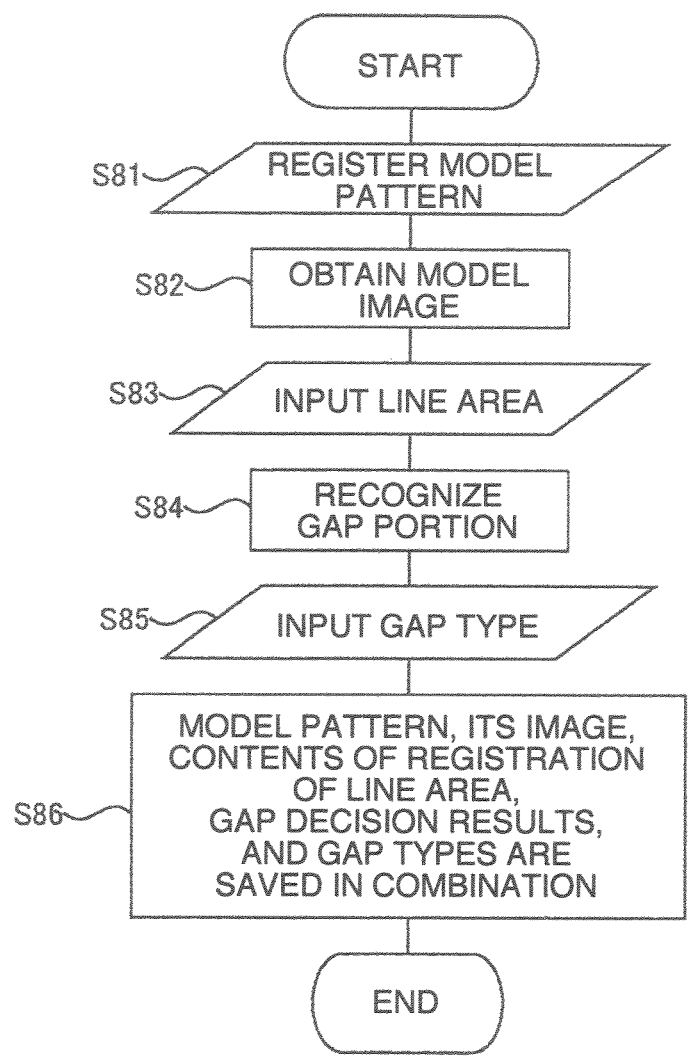
FIG. 18 is a flowchart illustrating a process for registering a model pattern.

In the embodiment of FIG. 9, the operator has made decisions on two kinds of gaps and performed gap decisions on measured patterns based on the results. In contrast, in a new aspect of execution, a pattern portion assuring a gap decision is previously registered as a model pattern. During a measurement, using the registered model pattern, a model image for a gap decision is acquired. During a measurement, based on the previously registered information, an image of a model pattern is obtained as a model image using a pattern on the same wafer as a pattern to be measured (S61). Calculation of a secondary electron profile is performed (S62). Extraction of a spacer profile is done (S63). A gap decision on the model image is automatically made (S64). Subsequently, an image of the pattern to be measured is taken (S65). In the measured pattern image, a secondary electron profile is calculated (S66). A spacer profile is extracted (S67). Then, a pattern decision on the measured image is made by utilizing the features of the profile of the model image (S68). If the gap decision (S69) is made successfully, a dimension measurement is made separately for each gap type based on the decision result (S70). If there are other measurement points, a new image of a pattern to be measured is taken (S65). The sequence of S66-S70 is repeated as many times as there are measurement points (S71). The flow illustrated in FIG. 18 is a sequence of registration of a model pattern. First, during creation of a measurement recipe (a file in which a procedure for automatic measurement is recorded as a task list of the apparatus), a layout portion assuring discrimination of gap types is registered as a model pattern near the pattern to be measured (S81). Then, using an electron microscope image of a specified model pattern as a model image, an image is taken under the same conditions as during measurement (S82). One example of this model pattern is shown in FIG. 19. FIG. 19(a) is an example of layout of a chip 1701 formed on a semiconductor wafer. The hatched portions have a relatively high pattern density. Especially, a portion (such as a memory portion) in which a microscopic pattern is repetitively formed and at which the present invention is directed is referred to as a cell portion 1702. In the center 1703 of the cell portion, it is difficult to discern whether the gap portion of an adjacent mask pattern is a core gap or a spacer gap.

In contrast, as shown in FIG. 19(b), in the case of an SADP process, at an end portion 1704 of the cell portion, a core gap portion 1707 is surrounded by a mask pattern and closed. It is easy and reliable to discriminate between the core gap 1707 and a spacer gap 1708.

In the pattern decision method in the present embodiment, a portion assuring a pattern decision such as the cell end portion 1704 is registered as a model pattern. An image of the model pattern is registered as a model image. FIG. 19(b) is an example of an electron microscope image 1705 of the model pattern portion.

Then, the portion of the model image which has the same structure as a pattern actually measured (i.e., a line pattern portion 1709 surrounded by the dotted line in FIG. 19(b) in the case of the present embodiment) is registered (S83). Then, within the image of the selected line pattern portion, a gap portion is recognized using quantities of features of image (S84). The results of the recognition of the gap portion are displayed on the model image. The gap type of the displayed gap portion is registered using GUI by the operator (S85).

Finally, these kinds of registered information, i.e., model pattern, its model image, line area, gap decision results, and gap types, are collectively saved in the measurement recipe (S86). This model pattern registration needs to be done only once for measurement of wafers of the same quality and process step. Image acquisition at a model pattern used for pattern decision according to the present embodiment can be used for positioning of measurement locations. If it is used together with an image for positioning, the decision can be accomplished without deteriorating the throughput.

Figure 20:
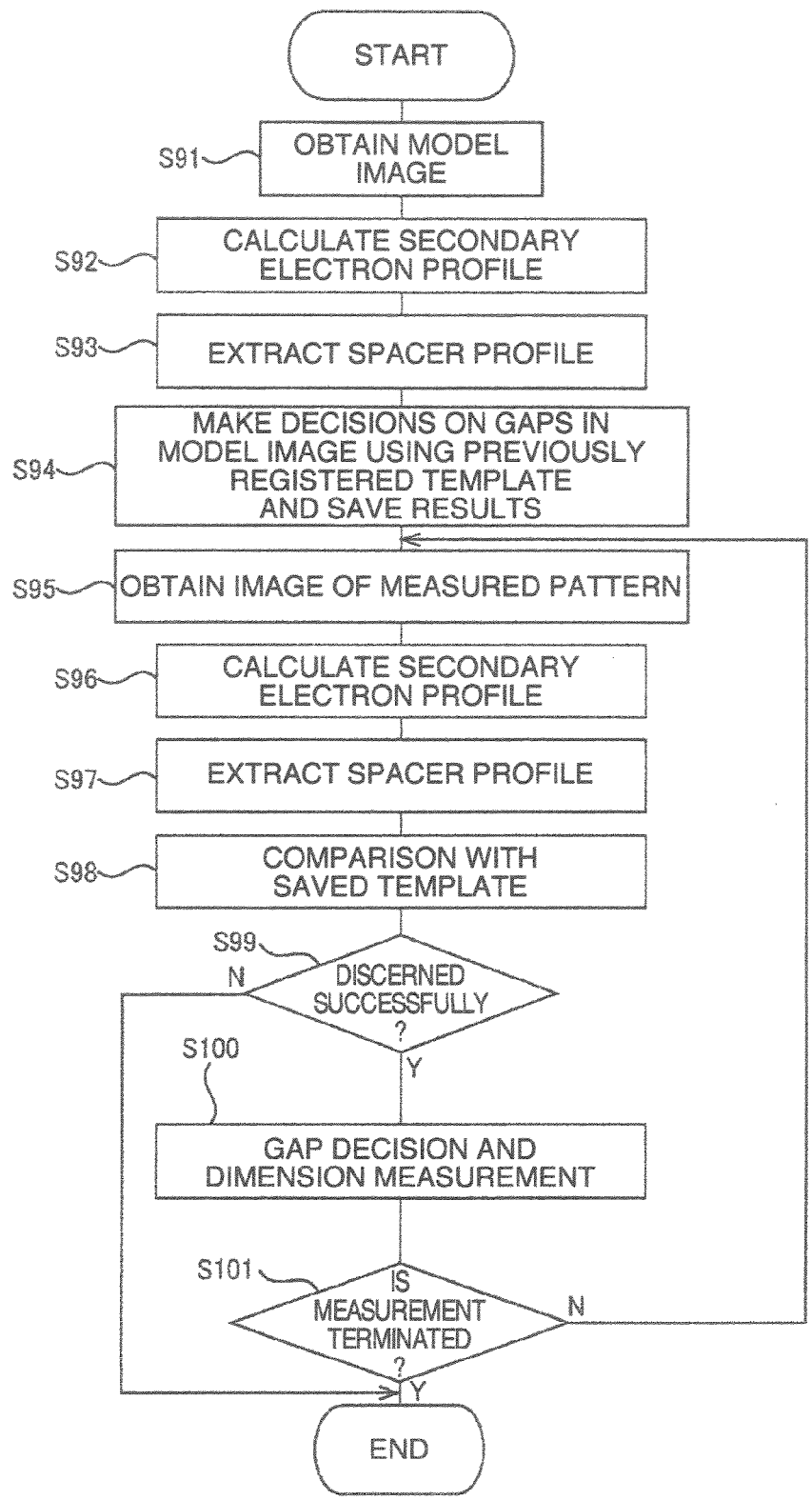
FIG. 20 is a flowchart illustrating a process consisting of creating a model pattern on the same sample as a pattern to be discerned, comparing a profile of the discerned pattern with the model pattern, and making a decision on gaps based on the comparison.

Because of these processings, the line pattern portion of the model image saved together with the measurement recipe becomes equivalent to the model image of the embodiment of FIG. 9. Accordingly, during measurement, prior to acquisition of an image of a pattern to be measured (S65), an image of the model pattern is obtained (S61) near it. Using information previously recorded in the recipe, the types of the spacers within the model pattern image are discerned (S64). In the model pattern previously registered, its layout assures that the types of spacers can be discerned. Hence, the type of the pattern contained in the line pattern portion 1709 within the model image can be discerned with certainty. Especially, a portion 1706 other than the line pattern portion within the model image contain information useful for discrimination of spacer types and so if matching using the portion 1706 other than the previously specified line pattern is done, discrimination of the spacer types can be realized easily. Since the line pattern portion 1709 of the model image obtained in this way is equivalent to the measured image whose spacer types have been discerned, the type of the pattern to be measured can be reliably discerned by performing steps S62-S71 of FIG. 17 using the image of that portion as a model image. The line portion image used in the present embodiment is an image of a portion different from the pattern to be measured, but has the same design layout, i.e., a pattern formed to have the same shape as the portion to be measured. Therefore, the difference hardly affects the result.

Where gap decisions are made on a pattern of the same sample in accordance with the present embodiment, the model image and the pattern of the measured image are comparable in performance and so there is the advantage that accurate decisions can be made. In the embodiment of FIG. 18, an example is given in which registration of a model pattern and recognition of gap portions are performed by an operator. Of course, these procedures can be performed using the design data while evaluating the uniqueness of the layout or the like. For example, where a measurement recipe is created using design data, a model pattern is registered in the design data. Before obtaining a model image, the line area 1709 in FIG. 19(b) and other area 1706 are previously registered on the design data. During measurement, an image is acquired from the registered model pattern. Based on the registered information, the line area 1709 and the other area 1706 are automatically established. Subsequently, measurements are made according to FIG. 17. Consequently, the time taken to create a recipe can be shortened. The work performed by the operator during measurement can be alleviated. Furthermore, in the description provided in connection with FIG. 17, gap decisions using feature quantities are taken as an example. Gaps can also be discerned by comparing image and profile saved in FIG. 18 with a template. Its flow is illustrated in FIG. 20.

An image of a model pattern that is a pattern on the same wafer as a pattern to be measured is acquired as a model image based on previously registered information (S91). Calculation of a secondary electron profile (S92) and extraction of a spacer profile (S93) are performed. Gap decisions on the model image are automatically made (S94). Subsequently, an image of the pattern to be measured is obtained (S95). Within the image of the measured pattern, calculation of a secondary electron profile (S96) and extraction of a spacer profile (S97) are performed and then a pattern decision on the image to be measured is made by utilizing the features of the profile of the model image (S98). If the gap decision (S99) is made successfully, a dimension measurement is performed for each separate gap type based on the decision result (S100). If there are other measurement points, an image of a pattern to be measured newly is obtained (S95). The sequence of S66 to S70 is repeated as many times as there are measurement points (S101).

Embodiment 4

In embodiment 3, an example is shown in which the center 1703 of the cell portion of FIG. 19 is taken as a desired measured pattern and in which the core gap 1707 and the spacer gap 1708 are discriminated using the end portion 1704 of the same cell. However, in actual semiconductor patterns, the cell central portion 1703 and cell end portion 1704 are not always identical in performance (dimensions, line edge roughness, tilt angle of pattern sidewall or the like, and differences in shape). Generally, in a location such as the cell portion 1702, the performance of the pattern in the cell central portion 1703 is stable. In contrast, shapes tend to produce differences at the cell end portion 1704. Therefore, the decision accuracy of the decision criteria for core gaps and spacer gaps on which decisions were made using the cell end portion 1703 deteriorates. During decisions on the gap type at the cell central portion 1703, erroneous decisions may occur. Furthermore, where the cell central portion 1703 and cell end portion 1704 are widely different in shape, the decision criteria created at the cell end portion 1704 might not be applicable to the cell central portion 1703. In contrast, in a form of a new embodiment, two stages of image acquisition steps used to discriminate gap types are provided, thus preventing erroneous decisions. Its flow is illustrated in FIG. 21.

Figure 21:
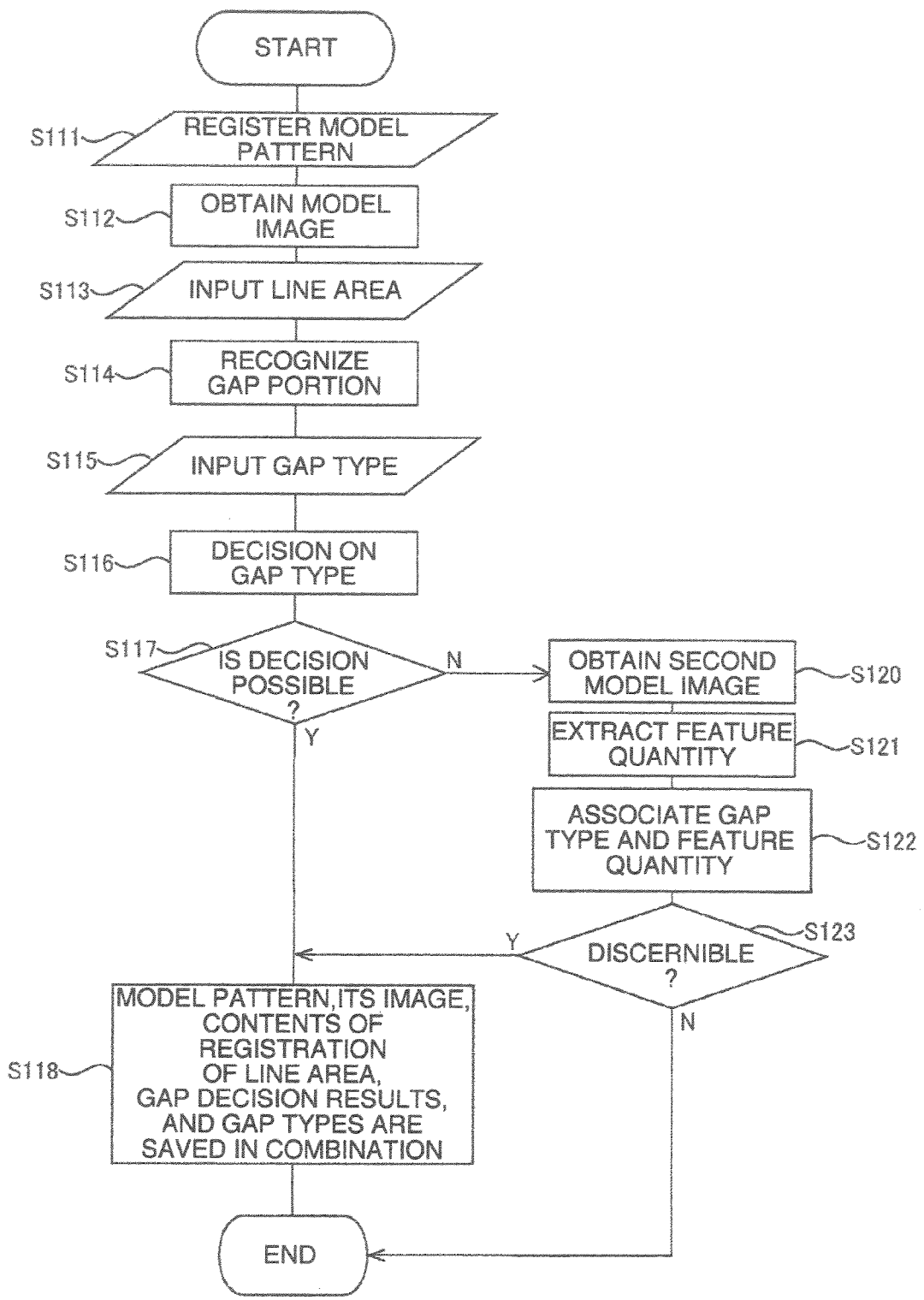
FIG. 21 is a flowchart illustrating steps for registering two model patterns.

The flow illustrated in FIG. 21 is a flow that is a model pattern registration procedure illustrated in FIG. 18 to which an erroneous decision suppressive sequence (S120, S121) described later is added. First, a model pattern is registered (S111). A model image is acquired (S112). A line area is inputted (S113). A gap portion is recognized (S114). The operator inputs a gap type (S115). Feature quantities for discriminating gap types are extracted and the gap types are discerned (S116). However, where the shape of the line pattern 1709 shown in FIG. 19(b) has variations or two types of gaps are little different in shape and it has been determined that it is difficult to discriminate two types of gaps from the obtained feature quantities (S117), an additional sequence (S120 to S122, described later) is carried out.

If matching is done using the portion 1706 other than the previously specified line pattern as shown in FIG. 19 as one example of method of recognizing gap portions, discernment of the gap types can be easily accomplished. In making a decision as to whether gaps can be discriminated, the degree of coincidence with a template is represented as a numerical value. A threshold value is set for the value. Thus, cases where the value is equal to or less than that are judged to be difficult.

Then, the second model image acquisition (S120) is described by referring to FIG. 22. A model image obtained in FIG. 21 (S112) will be hereinafter referred to as the first model image.

FIG. 22(a) 1901 shows a cell portion within a chip formed on a semiconductor wafer. The second model image is a model image for discerning gap types precisely during measurement, and is an image taken under the same conditions as during measurement when the operator specifies a location 1903 in which a pattern of a shape coincident with the shape of the measured pattern exists and which is closer to a measurement position 1902 than a first model image acquisition position 1904 and has moved into a range 1905 where a distance can be detected precisely by electron beam deflection from both positions. In order to precisely detect the position, an accuracy of field of view deviation within one line is required at this time. That is, the required accuracy of the electron beam deflection is within ½ pitch of the completed line pattern.

Since the first and second model images have precise positional information relying on the deflection accuracy of the electron beam, core gap and spacer gap discerned within the first model image can be discriminated also within the second model image according to the position. Accordingly, the gap portions are recognized in the first model image. In the second model image, extraction of feature quantities for discerning gap types is done. In the line area in the second model image, gap types are automatically discerned from the results of recognition of gaps performed within the first model image, and feature quantities for discriminating gaps are extracted (S121). Gap types and feature quantities are associated with each other (S122). It is checked that gap types can be discerned using the second model image (S123). The obtained results of recognition of gaps and the results of discrimination of gap types are saved in the measurement recipe (S118) and used during execution of measurement sequence shown in FIG. 23. Where it is difficult to extract feature quantities and discern gaps with the second model image, the present sequence is terminated.

Figure 23:
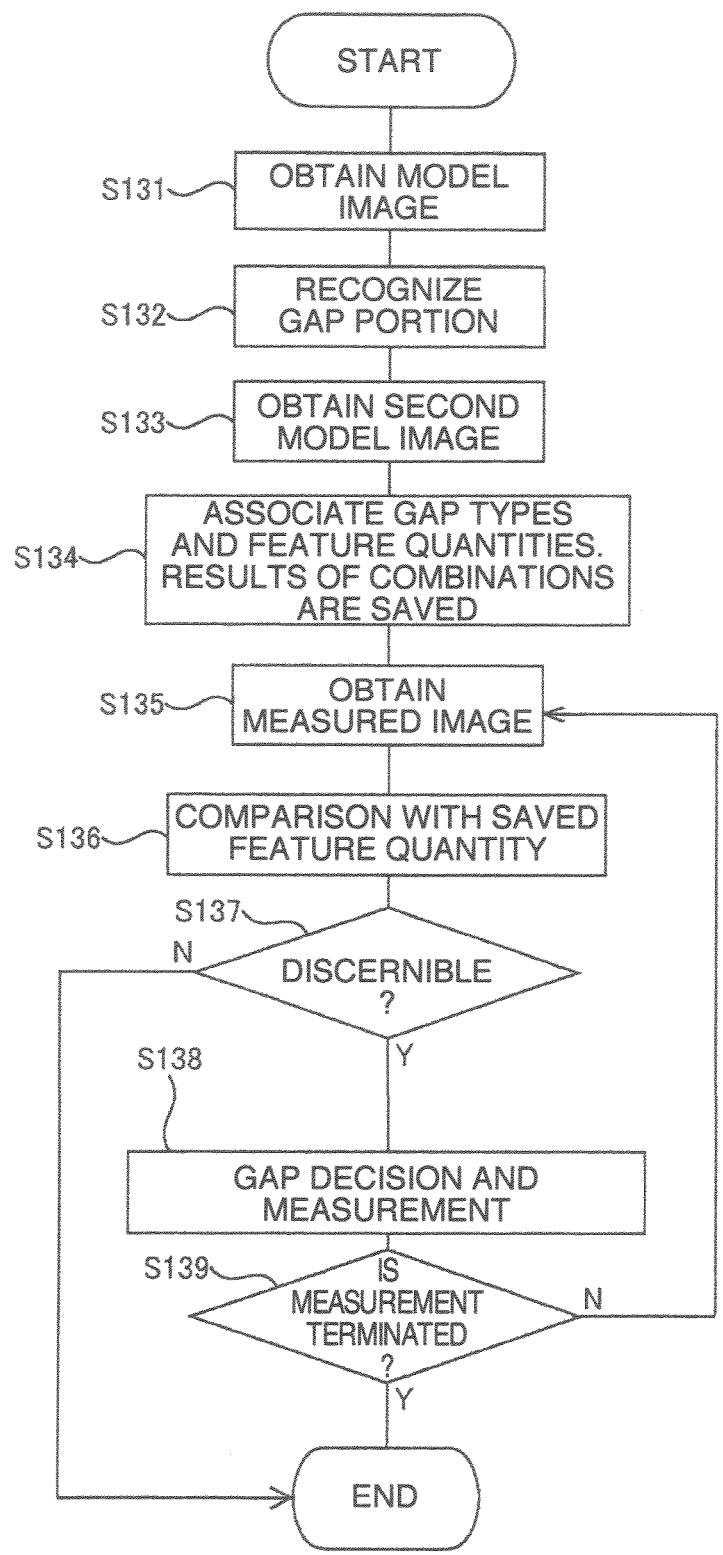
FIG. 23 is a flowchart illustrating steps for making decisions on gaps and measuring patterns by the use of two model patterns previously registered.

In the sequence of FIG. 23, on the wafer to be measured, an image is obtained with the first model previously registered in FIG. 21 (S131). Gap types are discerned (S132). An image of the second model is obtained (S133). Quantities of features are extracted, and gap types and feature quantities are associated with each other (S134). An image to be measured is obtained (S135) and compared with the saved feature quantities (S136). Gap types are discerned (S137). A measurement is made for each type in accordance with the decision results (S138). The sequence of S135 to S138 is repeated as many times as there are measurement points (S139). In the description provided in connection with FIG. 22, gap discrimination relying on feature quantities (S124) is taken as an example. In the same way as in FIG. 20, associating gap types and feature quantities (S134) can be replaced by associating gap types and results of gap decision using template matching.

In the case of a DP pattern other than SADP, the shapes of line end portions do not permit the types of line patterns to be discerned. In such a case, if a peripheral pattern is used, line patterns can be discerned in the same way as in the third embodiment. In this case, the conditions for the first image are required that they can assure that the image is taken on the most outside line within the cell or ensure what portion of the pattern has been taken. For example, the first model image is obtained such that a cell end portion (1907 surrounded by the broken line) enters as shown in FIG. 22(b). The type of the line pattern of the cell end portion 1907 can be easily checked from the design data about this portion. The type of the line pattern can be entered by the operator in accordance with the sequence of FIG. 21 (S95). Assuming that the performance of the end portion is poor and the line might vanish, the positioning accuracy is enhanced further by taking an image of a characteristic pattern 1906 other than the line pattern within the same field of view. Design data may be used for gap discriminations.

Regarding the above-described gap decisions, if the semiconductor fabrication processes mature, differences in cross-sectional shape between patterns decrease, creating the possibility that it is difficult to discriminate gaps. In such a case, it is possible to cope with the situation using the two-stage model image acquisition shown in the fourth embodiment. As described previously, it can be expected that the second model image acquisition portion and the portion to be measured will be comparable in pattern performance. Therefore, where the dimensions are different though their shapes are identical, the dimensional difference between core gap and spacer gap are at the same level between these two patterns. Therefore, if the dimensions of the core and spacer gaps are used as quantities of features of the image, decisions relying on dimensional difference are enabled in the same way as decisions relying on cross-sectional shape of the second embodiment. Where there is no difference in pattern shape or dimension, correct discriminations cannot be made. In this case, the pattern is formed uniformly and in a good state. Therefore, an output to that effect, or the result, may be provided.

In the description of all of the above-described embodiments, decisions on SADP mask shapes are taken as examples. Even after the final pattern etch of FIG. 2(*j*), the pattern sidewall shapes of core gap and spacer gap vary due to the difference in mask shape of FIG. 2(*h*) and so pattern decisions can be made by a similar procedure. In addition, if the aforementioned gap decision method is applied to other double patterning process, two sets of patterns can be discerned similarly. In consequence, measurements of pattern dimensions and process management and control can be accomplished based on the results.

REFERENCE SIGNS LIST

101: electron source
102: extraction electrode
103: primary electron beam
104: first condenser lens
105: aperture
106: second condenser lens
107: secondary electron detector
108: alignment coil
109: deflection coils
110: objective lens
111: sample
112: stage
113: sample chamber
114: secondary electrons
115: high-voltage controller
116: first condenser lens control portion
117: second condenser lens control portion
118: secondary electron signal amplifier
119: alignment control portion
120, 122: deflection signal control portions
121: objective lens control portion
123: image processing processor
124: secondary electron image display device
125: overall controller
126: electron optics controller
127: stage controller
128: user interface

The invention claimed is:

1. A pattern measuring apparatus for measuring a pattern of a sample, in which plural patterns are arranged, by the use of a signal obtained based on scanning of a charged particle beam relative to the sample, said pattern measuring apparatus comprising:

a decision device for extracting, regarding one end side of the pattern in which the plural patterns are arranged and other end side of the pattern, from a waveform signal obtained based on the scanning of the charged particle beam, at least one of distances between peak points of peaks of the waveform signal and rising points of the peaks, peak heights of a differential waveform of the waveform signal and distances between rising points of the differential waveform;

for comparing at least one of the distances between the peak points of the peak of the waveform signal and the rising points of the peak, the peak heights, and the distances between rising points of the differential waveform; and for judging, as a core gap, a gap located on the one side or the other side where the waveform signal has a smaller distance of the distances between peak points of peaks of the waveform signal and rising points of the peaks, a gap located on the one end side or the other end side where the differential waveform has a higher peak of the peak heights and/or a gap located on the one end side or other side where the differential waveform has a smaller distance of the distances between the rising points of the peaks of the differential waveform.

2. The pattern measuring apparatus of claim 1, wherein the pattern is formed by self-aligned double patterning.

3. The pattern measuring apparatus of claim 1, wherein an edge at the one end side of the pattern and an edge at the other end side of the pattern have been formed by separate manufacturing steps.

4. A computer program stored on a non-transitory computer readable medium for use with a computer connected with a charged particle beam instrument for measuring a pattern of a sample which plural patterns are arranged, based on a signal obtained by scanning the charged particle beam over the sample and for causing the computer to discern types of portions on the sample from the signal, wherein said program causes the computer to extract regarding a side of one end of a pattern in which the plural patterns are arranged and a side of the other end of the pattern from a waveform signal obtained based on the scanning of the charged particle beam and at least one of distances between peak points of peaks of the waveform signal and rising points of the peaks, peak heights of a differential waveform of the waveform signal and distances between rising points of the differential waveform;

to compare at least one of the distances between the peak points of the peak of the waveform signal and the rising points of the peak, the peak heights, and the distances between rising points of the differential waveform; and to judge, as a core gap, a gap located on the one side or the other side where the waveform signal has a smaller distance of the distances between peak points of peaks of the waveform signal and rising points of the peaks, a gap located on the one end side or the other end side where the differential waveform has a higher peak of the peak heights and/or a gap located on the one end side or other side where the differential waveform has a smaller distance of the distances between the rising points of the peaks of the differential waveform.

5. A pattern measuring apparatus for measuring a pattern of a sample, in which plural patterns are arranged, by the use of a signal obtained based on scanning of a charged particle beam relative to the sample, said pattern measuring apparatus comprising:
- a decision device for extracting, regarding one end side of the pattern in which the plural patterns are arranged and other end side of the pattern, from a waveform signal obtained based on the scanning of the charged particle beam, at least one of distances between peak points of peaks of the waveform signal and rising points of the peaks, peak heights of a differential waveform of the waveform signal and distances between rising points of the differential waveform;
- for comparing at least one of the distances between the peak points of the peak of the waveform signal and the rising points of the peak, the peak heights, and the distances between rising points of the differential waveform; and
- for judging, as a spacer gap, a gap located on the one side or the other side where the waveform signal has a longer distance of the distances between peak points of peaks of the waveform signal and rising points of the peaks, a gap located on the one end side or the other end side where the differential waveform has a lower peak of the peak heights and/or a gap located on the one end side or other side where the differential waveform has a longer distance of the distances between the rising points of the peaks of the differential waveform.

6. The pattern measuring apparatus of claim 5, wherein the pattern is formed by self-aligned double patterning.

7. The pattern measuring apparatus of claim 5, wherein an edge at the one end side of the pattern and an edge at the other end side of the pattern have been formed by separate manufacturing steps.

* * * * *